US011158601B2

(12) United States Patent
Sakamoto et al.

(10) Patent No.: US 11,158,601 B2
(45) Date of Patent: Oct. 26, 2021

(54) LAMINATED ELEMENT MANUFACTURING METHOD

(71) Applicant: HAMAMATSU PHOTONICS K.K., Hamamatsu (JP)

(72) Inventors: Takeshi Sakamoto, Hamamatsu (JP); Ryuji Sugiura, Hamamatsu (JP); Yuta Kondoh, Hamamatsu (JP); Naoki Uchiyama, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 16/633,240

(22) PCT Filed: Jul. 18, 2018

(86) PCT No.: PCT/JP2018/026886
§ 371 (c)(1),
(2) Date: Jan. 23, 2020

(87) PCT Pub. No.: WO2019/021903
PCT Pub. Date: Jan. 31, 2019

(65) Prior Publication Data
US 2020/0176415 A1    Jun. 4, 2020

(30) Foreign Application Priority Data
Jul. 28, 2017    (JP) .............................. JP2017-146859

(51) Int. Cl.
*H01L 21/268*    (2006.01)
*H01L 23/00*    (2006.01)
(Continued)

(52) U.S. Cl.
CPC ............ *H01L 24/83* (2013.01); *H01L 21/268* (2013.01); *H01L 21/78* (2013.01); *H01L 24/27* (2013.01);
(Continued)

(58) Field of Classification Search
CPC ....... H01L 24/83; H01L 21/268; H01L 21/78; H01L 24/27; H01L 24/29; H01L 24/32;
(Continued)

(56) References Cited

U.S. PATENT DOCUMENTS 8,901,727 B2 * 12/2014 Kang ...................... H01L 23/28
257/686
2008/0191310 A1 * 8/2008 Wu ...................... H01L 21/2007
257/508

FOREIGN PATENT DOCUMENTS

JP    2006-013312 A    1/2006
JP    2007-142001 A    6/2007
(Continued)

OTHER PUBLICATIONS

International Preliminary Report on Patentability dated Feb. 6, 2020 for PCT/JP2018/026886.

*Primary Examiner* — Vu A Vu
(74) *Attorney, Agent, or Firm* — Faegre Drinker Biddle & Reath LLP

(57) ABSTRACT

A laminating step includes a first bonding step of bonding a circuit layer of a second wafer to a circuit layer of a first wafer, a grinding step of grinding a semiconductor substrate of the second wafer, and a second bonding step of bonding a circuit layer of the third wafer to the semiconductor substrate of the second wafer. In a laser light irradiation step, a modified region is formed and a fracture extends from the modified region along a laminating direction of a laminated body by irradiating the semiconductor substrate of the first wafer with a laser light.

8 Claims, 20 Drawing Sheets

(51) Int. Cl.
 *H01L 21/78* (2006.01)
 *H01L 27/06* (2006.01)
(52) U.S. Cl.
 CPC .............. *H01L 24/29* (2013.01); *H01L 24/32* (2013.01); *H01L 27/0688* (2013.01); *H01L 2224/83947* (2013.01)
(58) Field of Classification Search
 CPC ....... H01L 27/0688; H01L 2224/83947; H01L 21/8221; B23K 26/00; B23K 26/53
 USPC ......................................................... 438/118
 See application file for complete search history.

(56) References Cited

FOREIGN PATENT DOCUMENTS

| | | |
|---|---|---|
| JP | 2009-289773 A | 12/2009 |
| JP | 2010-103245 A | 5/2010 |
| JP | 2012-109357 A | 6/2012 |
| JP | 2014-017434 A | 1/2014 |
| JP | 2014-028388 A | 2/2014 |
| JP | 2015-050226 A | 3/2015 |
| JP | 2015-119109 A | 6/2015 |

\* cited by examiner (a)

| LOWER END DISTANCE | 31 μm | 69 μm | 107 μm | 146 μm | 189 μm | 220 μm | 252 μm |
|---|---|---|---|---|---|---|---|
| CROSS SECTION | 72(7) 71(7) | 72(7) 71(7) | 72(7) 71(7) | 72(7) 71(7) | 72(7) 71(7) | 72(7) 71(7) | 72(7) 71(7) |
| END SURFACE | | | | | | | |
| DAMAGE | YES | YES | NO | NO | NO | NO | NO |
| DISTANCE | ONE SIDE 72 μm | ONE SIDE 134 μm | ONE SIDE 64 μm | ONE SIDE 61 μm | ONE SIDE 29 μm | | |

(a)

(b)

(a)

(b)

(a)

(b)

LAMINATED ELEMENT MANUFACTURING METHOD

TECHNICAL FIELD

One aspect of the present invention relates to a laminated element manufacturing method.

BACKGROUND ART

Patent Literature 1 discloses a method of cutting a semiconductor wafer. In the method, the street of the semiconductor wafer is cut in a manner that a cutting blade that rotates at high speed is lowered while a chuck table is caused to reciprocate, in a state where the semiconductor wafer is attracted and held on the chuck table. The semiconductor wafer is diced by performing the above cutting on all streets, and thus is divided into individual semiconductor chips.

CITATION LIST

Patent Literature

Patent Literature 1: Japanese Unexamined Patent Publication No. 2006-013312

SUMMARY OF INVENTION

Technical Problem

Currently, for example, in a field of a semiconductor memory such as a dynamic random access memory (DRAM), development of a laminated element configured by laminating a plurality of elements proceeds, and both thinning of the laminated element and improvement of yield are expected to be realized.

Thus, an object of one aspect of the present invention is to provide a laminated element manufacturing method in which it is possible to achieve both thinning of a laminated element and improvement of yield.

Solution to Problem

The present inventors have earnestly studied in order to solve the aforementioned problems, and have obtained the following knowledge. That is, when a laminated body of a semiconductor wafer is cut, a modified region is formed and a fracture extends from the modified region by irradiating a substrate portion of the semiconductor wafer constituting the laminated body with a laser light. Thus, it is possible to cut the laminated body while suppressing chipping at a bonding boundary between the semiconductor wafers. One aspect of the present invention has been made based on such findings.

That is, a laminated element manufacturing method according to one aspect of the present invention includes a laminating step of forming a laminated body of a semiconductor wafer including a semiconductor substrate having a front surface and a rear surface and a circuit layer including a plurality of functional elements arranged in two-dimension along the front surface, and a laser light irradiation step of forming a modified region and a fracture in the laminated body by irradiating the laminated body with a laser light after the laminating step. The laminating step includes a first bonding step of preparing, as the semiconductor wafer, a first wafer and a second wafer, and bonding the circuit layer of the second wafer to the circuit layer of the first wafer such that the respective functional elements of the first wafer and the respective functional elements of the second wafer correspond to each other, a grinding step of grinding the semiconductor substrate of the second wafer after the first bonding step, and a second bonding step of preparing a third wafer as the semiconductor wafer after the grinding step, and bonding the circuit layer of the third wafer to the semiconductor substrate of the second wafer such that the respective functional elements of the second wafer and the respective functional elements of the third wafer correspond to each other. In the laser light irradiation step, the modified region is formed along a line to cut set to pass between the functional elements and the fracture extends from the modified region along a laminating direction of the laminated body by irradiating the semiconductor substrate of the first wafer with the laser light along the line to cut.

Alternatively, a laminated element manufacturing method according to another aspect of the present invention includes a laminating step of forming a laminated body of a semiconductor wafer including a semiconductor substrate having a front surface and a rear surface and a circuit layer including a plurality of functional elements arranged in two-dimension along the front surface, a laser light irradiation step of forming a modified region and a fracture in the laminated body by irradiating the laminated body with a laser light after the laminating step. The laminating step includes a first bonding step of preparing, as the semiconductor wafer, a first wafer and a second wafer, and bonding the circuit layer of the second wafer to the semiconductor substrate of the first wafer such that the respective functional elements of the first wafer and the respective functional elements of the second wafer correspond to each other, a grinding step of grinding the semiconductor substrate of the second wafer after the first bonding step, and a second bonding step of preparing a third wafer as the semiconductor wafer after the grinding step, and bonding the circuit layer of the third wafer to the semiconductor substrate of the second wafer such that the respective functional elements of the second wafer and the respective functional elements of the third wafer correspond to each other. In the laser light irradiation step, the modified region is formed along a line to cut set to pass between the functional elements and the fracture extends from the modified region along a laminating direction of the laminated body by irradiating the semiconductor substrate of the third wafer with the laser light along the line to cut.

In these methods, the grinding step of grinding and thinning the semiconductor substrate of the semiconductor wafer (here, the second wafer) is performed when the laminated body of the semiconductor wafers is formed. Accordingly, the thin laminated body can be obtained. When blade dicing is used for cutting such a laminated body, a yield is significantly reduced due to chipping. Meanwhile, in this method, the modified region is formed and the fracture extends from the modified region in the laminating direction by irradiating the semiconductor substrate of the semiconductor wafer with the laser light along the line to cut. Accordingly, it is possible to cut the laminated body while suppressing chipping in the bonding boundary between the semiconductor wafers. Therefore, according to this method, it is possible to achieve both the thickness reduction of the laminated element and the improvement of the yield.

Of the aforementioned methods, in the method of bonding the circuit layer of the second wafer to the semiconductor substrate of the first wafer in the first bonding step, the laminating step may include a preparation step of preparing a support substrate and the first wafer, and bonding the circuit layer of the first wafer to the support substrate before the first bonding step, and in the first bonding step, the second wafer and the first wafer bonded to the support substrate are prepared. In this case, it is easy to handle the first wafer in the first bonding step. In this case, the laminated element manufacturing method may further include a support substrate removal step of removing the support substrate after the laminating step and before the laser light irradiation step, or after the laser light irradiation step. This support substrate removal step can be performed before the cutting step to be described below.

In the laminated element manufacturing method according to the aspect of the present invention, in the laser light irradiation step, the modified region may be formed such that the fracture reaches both ends of the laminated body in the laminating direction. In this case, it is possible to suppress the warpage of the laminated body.

In the laminated element manufacturing method according to the aspect of the present invention, the laser light irradiation step may include a first laser light irradiation step of Banning, as the modified region, a first modified region by irradiating the semiconductor substrate with the laser light from the rear surface side, and a second laser light irradiation step of extending the fracture such that the fracture reaches the both ends by forming, as the modified region, a second modified region between the first modified region and the rear surface by irradiating the semiconductor substrate with the laser light from the rear surface side. In this case, the fracture can extend so as to reliably reach both ends of the laminated body.

The laminated element manufacturing method according to the aspect of the present invention may further include a modified region removal step of removing the modified region by grinding the semiconductor substrate on which the modified region is formed after the laser light irradiation step. In this case, bending strength is improved.

The laminated element manufacturing method according to the aspect of the present invention may further include a cutting step of cutting the laminated body along the line to cut by applying stress to the laminated body after the laser light irradiation step. In this case, the laminated body can be reliably cut.

Advantageous Effects of Invention

According to the aspect of present invention, it is possible to provide a laminated element manufacturing method in which it is possible to achieve both thinning of a laminated element and improvement of yield.

BRIEF DESCRIPTION OF DRAWINGS

FIG. 16 is a table representing a relationship between a lower end distance and splash damage.

DESCRIPTION OF EMBODIMENTS

Figure 1:
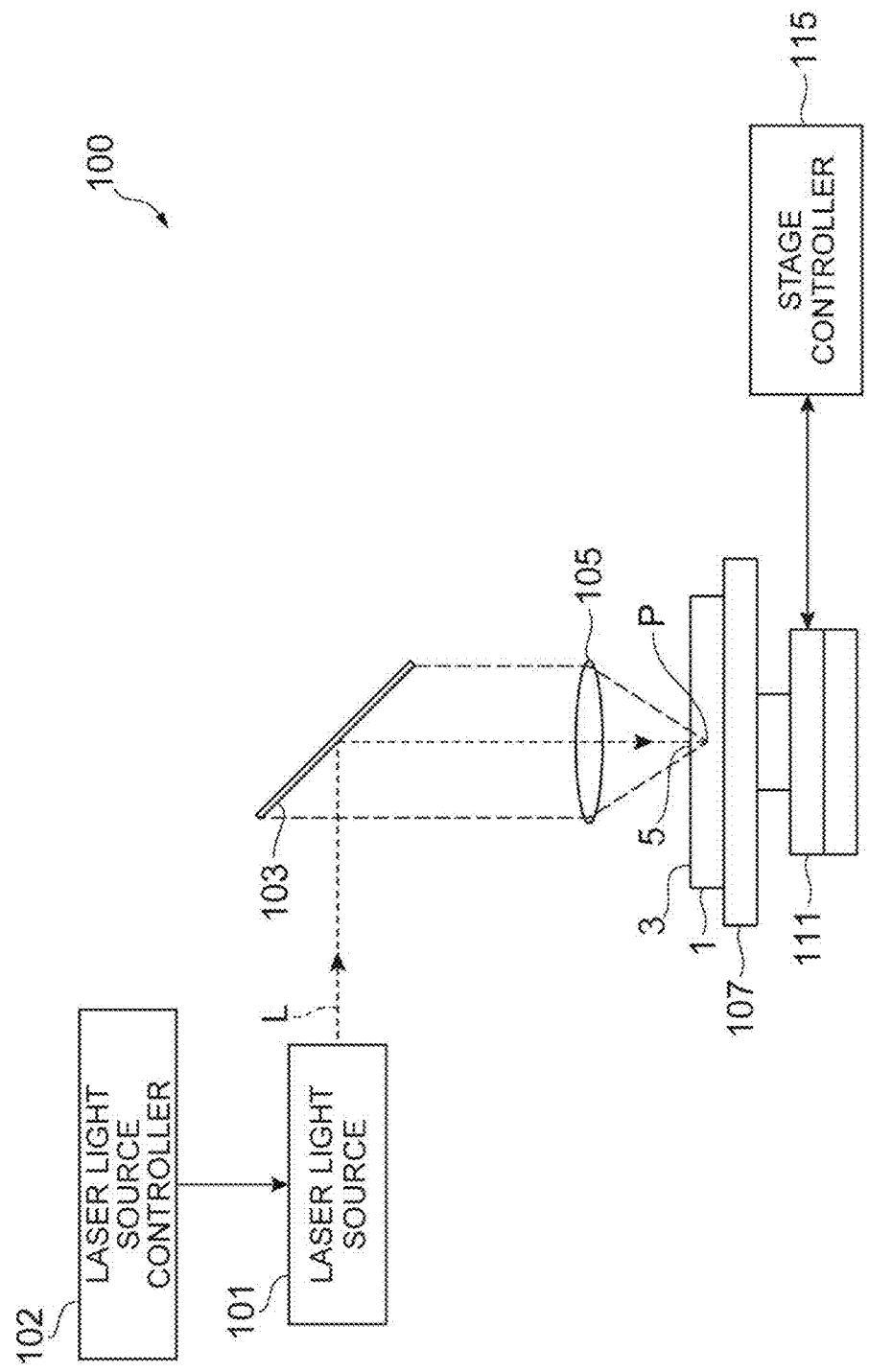
FIG. 1 is a schematic configuration diagram illustrating a laser processing device used for forming a modified region.

Hereinafter, an embodiment will be described in detail with reference to the drawings. In the drawings, the same elements or the corresponding elements are denoted by the same reference signs, and repetitive descriptions thereof will be omitted.

According to an embodiment, in a laminated element manufacturing method, a modified region is formed in a processing target along a line to cut by condensing a laser light on the processing target (laminated body of semiconductor wafers as an example). Firstly, formation of the modified region will be described with reference to FIGS. 1 to 6.

As illustrated in FIG. 1, a laser processing device 100 includes a laser light source 101 that pulse-oscillates a laser light L, a dichroic mirror 103 arranged to change the direction of an optical axis (optical path) of the laser light L by 90°, and a condensing lens 105 that condenses the laser light L. Further, the laser processing device 100 includes a support base 107 for supporting a processing target 1 irradiated with the laser light L condensed by the condensing lens 105, a stage 111 for moving the support base 107, a laser light source controller 102 that controls the laser light source 101 in order to adjust an output, a pulse width, a pulse waveform, or the like of the laser light L, and a stage controller 115 that controls movement of the stage 111.

In the laser processing device 100, regarding the laser light L emitted from the laser light source 101, the direction of the optical axis of the laser light L is changed by 90° by the dichroic mirror 103, and then, the laser light L is condensed by the condensing lens 105 in the processing target 1 placed on the support base 107. At the same time, the stage 111 is moved, and the processing target 1 is moved relative to the laser light L along a line to cut 5. Thus, a modified region is formed in the processing target 1 along the line to cut 5. Here, the stage 111 is moved to move the laser light L relatively, but the condensing lens 105 may be moved, or both thereof may be moved.

Figure 2:
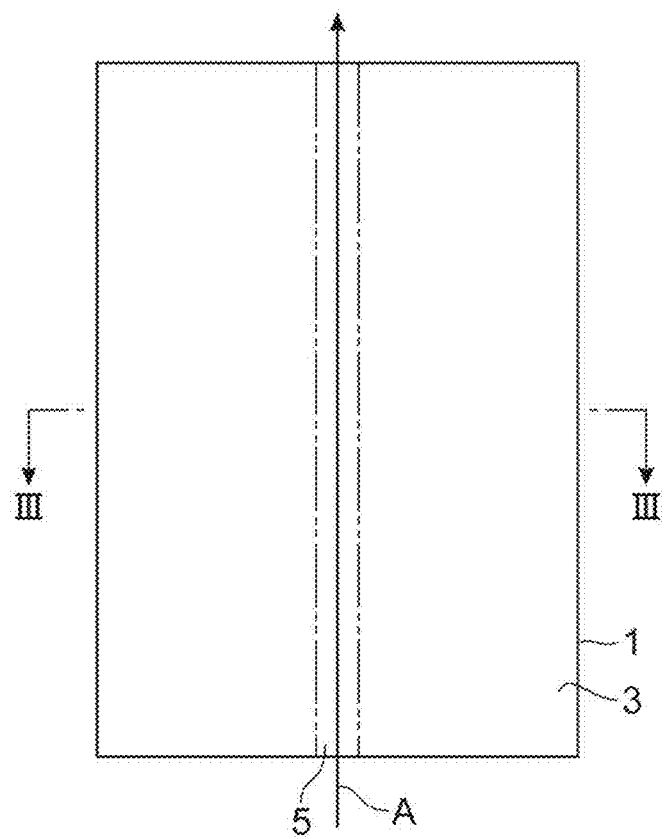
FIG. 2 is a plan view illustrating a processing target as a target of forming the modified region.
Figure 3:
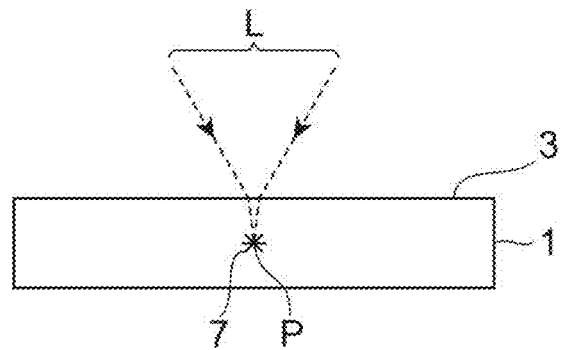
FIG. 3 is a sectional view of the processing target taken along line III-III in FIG. 2.
Figure 4:
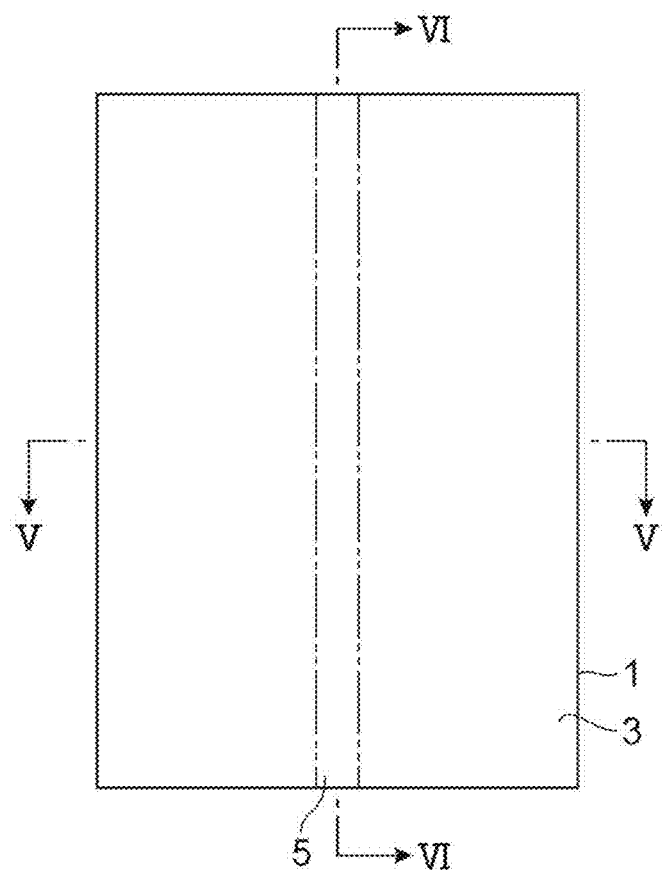
FIG. 4 is a plan view illustrating the processing target after laser processing.
Figure 5:
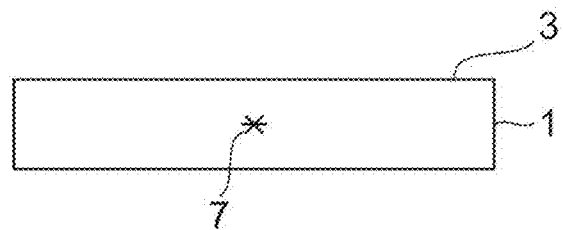
FIG. 5 is a sectional view of the processing target taken along line V-V in FIG. 4.
Figure 6:
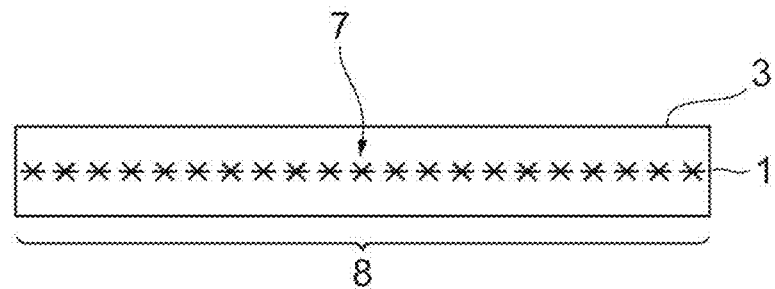
FIG. 6 is a sectional view of the processing target taken along line VI-VI in FIG. 4.

As the processing target 1, a plate-like member (for example, a substrate and a wafer) including a semiconductor substrate made of a semiconductor material, a piezoelectric substrate made of a piezoelectric material, or the like is used. As illustrated in FIG. 2, the line to cut 5 for cutting the processing target 1 is set on the processing target 1. The line to cut 5 is a virtual line extending in a straight line. In a case where the modified region is formed in the processing target 1, as illustrated in FIG. 3, the laser light L is relatively moved along the line to cut 5 (that is, in a direction indicated by an arrow A in FIG. 2) in a state where a focusing point (focusing position) P is aligned in the processing target 1 Thus, as illustrated in FIGS. 4 to 6, the modified region 7 is formed in the processing target 1 along the line to cut 5, and the modified region 7 formed along the line to cut 5 functions as a cutting start region 8.

The focusing point P is a location in which the laser light L is condensed. The line to cut 5 is not limited to a straight line and may be a curved line, a three-dimensional combination of the lines, or a coordinate designated. The line to cut 5 is not limited to a virtual line and may be a line actually drawn on the front surface 3 of the processing target 1. The modified region 7 may be formed continuously or intermittently. The modified region 7 may be in a form of a row or a dot. In short, the modified region 7 may be formed at least in the processing target 1. A fracture may be formed at a start point of the modified region 7. The fracture and the modified region 7 may be exposed to the outer surface (front surface 3, back surface, or outer circumferential surface) of the processing target 1. An incident surface of the laser light when the modified region 7 is formed is not limited to the front surface 3 of the processing target 1 and may be the back surface of the processing target 1.

In a case where the modified region 7 is formed in the processing target 1, the laser light L passes through the processing target 1 and is particularly absorbed in the vicinity of the focusing point P located in the processing target 1. Thus, the modified region 7 is formed in the processing target 1 (that is, internal absorption laser processing). In this case, since the laser light L is hardly absorbed by the front surface 3 of the processing target 1, the front surface 3 of the processing target 1 is not melted. In a case where the modified region 7 is formed on the front surface 3 of the processing target 1, the laser light L is particularly absorbed in the vicinity of the focusing point P located on the front surface 3. Thus, melting and removing are performed from the front surface 3, and a removal portion such as a hole or a groove is formed (surface absorption laser processing).

The modified region 7 is a region in which the density, refractive index, mechanical strength, and other physical characteristics are different from those of the surroundings. Examples of the modified region 7 include a melting treatment region (which means at least any one of a region which is solidified again after melting once, a region in a melted state, and a region in a state of being solidified again from melting), a crack region, a dielectric breakdown region, and a refractive index change region. In addition, a region in which the above regions are mixed is provided. Further, the modified region 7 includes a region in which, regarding the material of the processing target 1, the density in the modified region 7 is changed compared to the density in a non-modified region, or a region in which lattice defects are formed. In a case where the material of the processing target 1 is single crystal silicon, the modified region 7 may be referred to as a high dislocation density region.

Regarding the melting treatment region, the refractive index change region, the region in which the density in the modified region 7 is changed compared to the density in the non-modified region, and the region in which lattice defects are formed, a fracture (microcrack) may be included in these regions or at an interface between the modified region 7 and the non-modified region. The fracture to be included may be formed over the entire surface of the modified region 7 or may be formed only in a portion or in a plurality of portions. The processing target 1 includes a substrate made of a crystal material having a crystal structure. For example, the processing target 1 includes a substrate formed of at least any one of gallium nitride (GaN), silicon (Si), silicon carbide (SiC), $LiTaO_3$, and sapphire ($Al_2O_3$). In other words, for example, the processing target 1 includes a gallium nitride substrate, a silicon substrate, a SiC substrate, a $LiTaO_3$ substrate, or a sapphire substrate. The crystal material may be either anisotropic crystal or isotropic crystal. The processing target 1 may include a substrate made of an amorphous material having an amorphous structure, for example, a glass substrate.

In the embodiment, the modified region 7 may be formed by forming a plurality of modified spots (processing marks) along the line to cut 5. In this case, the modified region 7 is formed by collecting the plurality of modified spots. The modified spot is a modified portion formed by one pulse shot (that is, irradiation with one pulse laser: laser shot) of a pulsed laser light. Examples of the modified spot include a crack spot, a melting treatment spot, a refractive index change spot, or a mixture of at least one thereof. For the modified spot, considering the required cutting accuracy, required flatness of the cut surface, and the thickness, type, crystal orientation, and the like of the processing target 1, the size of the processing target 1 or the length of a fracture to be generated may be appropriately controlled. In the embodiment, the modified spot may be formed as the modified region 7, along the line to cut 5.

First Embodiment

Subsequently, an example of a laminated element manufacturing method according to a first embodiment will be described. This manufacturing method includes a lamination step of forming a laminated body of semiconductor wafers, and laser processing is performed on the laminated body formed by the lamination step as the processing object 1. Firstly, an example of the configuration of a laminated body and an example of a laminated element to be manufactured will be described.

Figure 7:
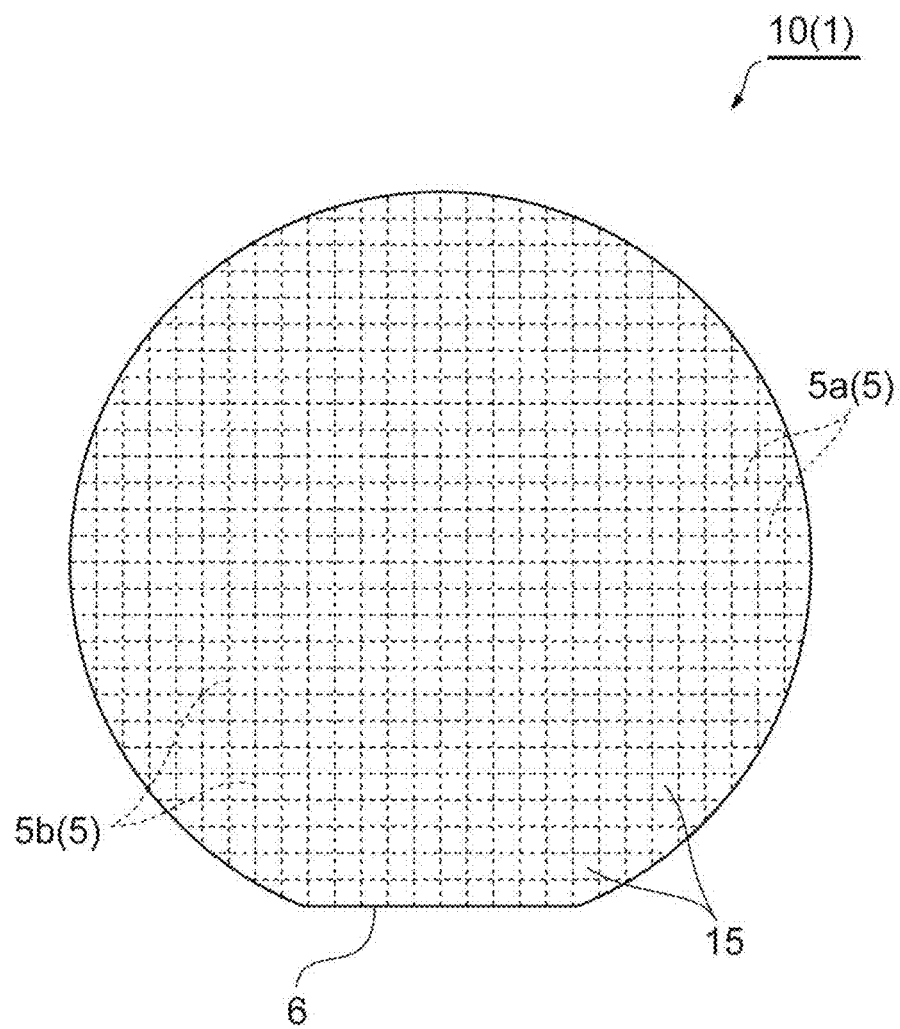
FIG. 7 is a plan view illustrating a laminated body as the processing target.
Figure 8:
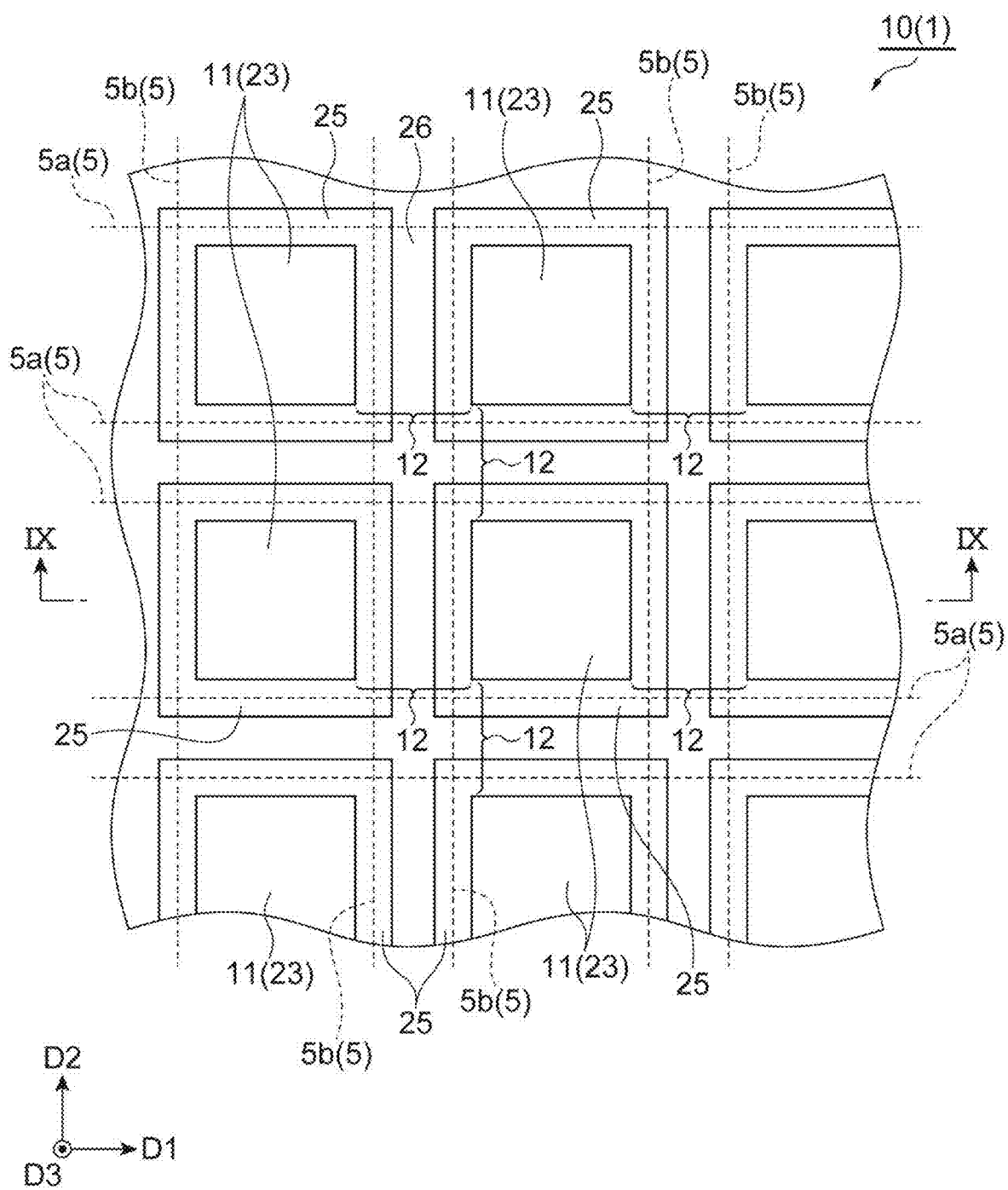
FIG. 8 is a schematic plan view illustrating an enlarged portion of the laminated body illustrated in FIG. 7.
Figure 9:
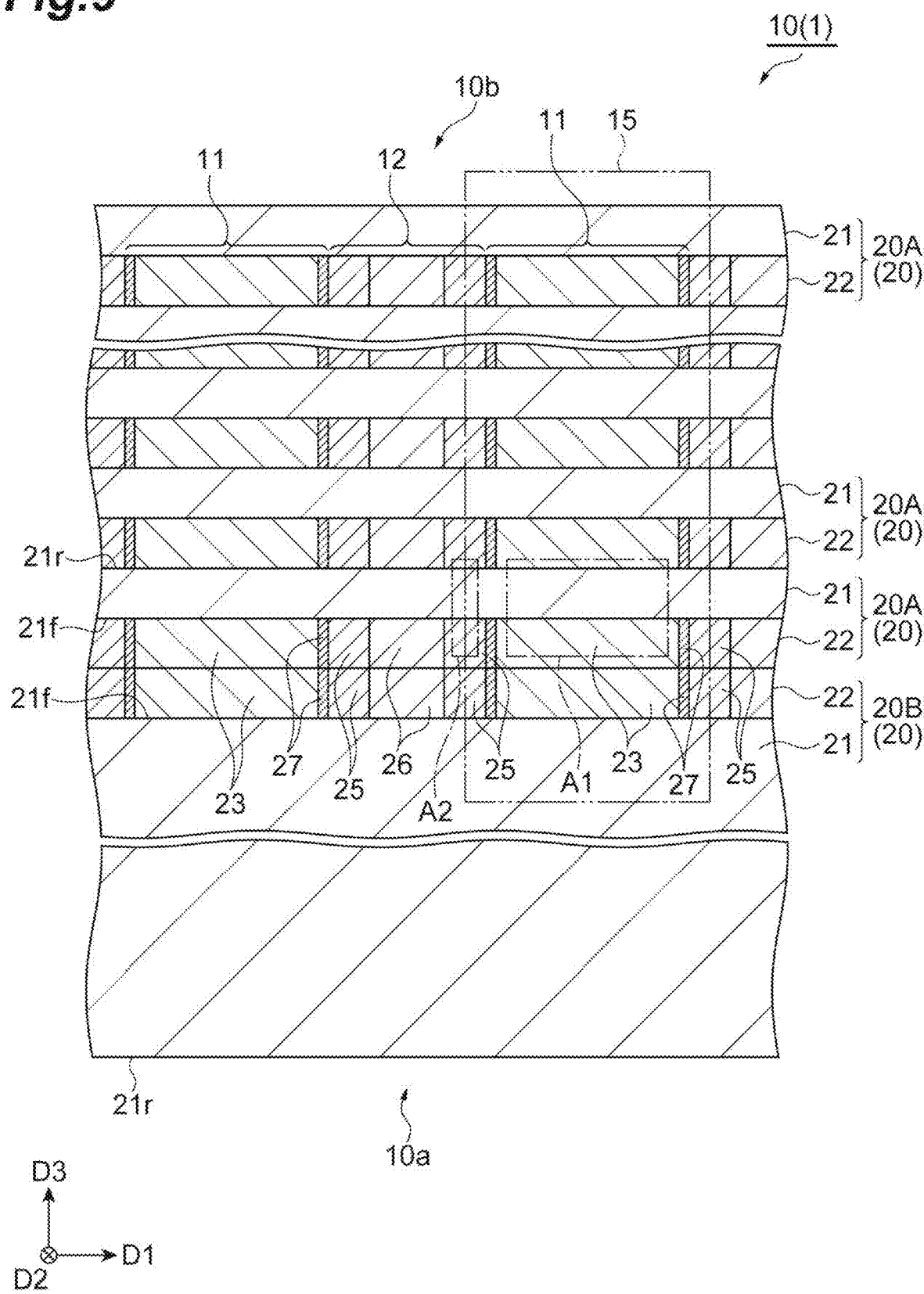
FIG. 9 is a schematic sectional view taken along line IX-IX in FIG. 8.

FIG. 7 is a plan view illustrating a laminated body as the processing target. FIG. 8 is a schematic plan view illustrating an enlarged portion of the laminated body illustrated in FIG. 7. FIG. 9 is a schematic sectional view taken along line IX-IX in FIG. 8. As illustrated in FIGS. 7 to 9, the laminated body 10 (processing target 1) includes an active region 11 and a cutting region 12. Active regions 11 are two-dimensionally arranged in a first direction D1 along an orientation flat 6 and a second direction D2 intersecting (orthogonal) with (to) the first direction D1. Cutting regions 12 are formed in a lattice shape to surround the active regions 11 when viewed from a third direction D3 intersecting (orthogonal) with (to) the first direction D1 and the second direction D2.

The laminated body 10 includes a plurality (here, ten) of semiconductor wafers 20 laminated on each other in the third direction D3. Each of the semiconductor wafers 20 includes a semiconductor substrate 21 and a circuit layer 22. The semiconductor substrate 21 includes a front surface 21f and a back surface 21r. The circuit layer 22 is formed on the front surface 21f and includes a plurality of functional elements 23 two-dimensionally arranged along the front surface 21f. One active region 11 is set across all the semiconductor wafers 20 to include a plurality of (here, ten) functional elements 23 laminated in a line in the third direction D3. In the manufacturing method, each active region 11 is cut out by cutting the laminated body 10 in the cutting region 12.

Therefore, a line to cut 5a along the first direction D1 and a line to cut 5b along the second direction D2 are set as the above-described line to cut 5, in the laminated body 10. The lines to cut 5a and 5b are set in the cutting region 12 to pass between the functional elements 23 adjacent to each other in the first direction D1 and the second direction D2. More specifically, in the cutting region 12, a circular street portion 25 is provided in the circuit layer 22 to surround the functional element 23, and a lattice-like metal wiring portion 26 is provided to surround the functional element 23 and the street portion 25. The metal wiring portion 26 is, for example, a TEG wiring.

The line to cut 5a is set in the first direction D1 such that the line to cut 5a passes through the metal wiring portion 26 between street portions 25 which are adjacent to each other in the first direction D1, while passing through the street portion 25 between the functional elements 23 adjacent to each other in the second direction D2. Further, the line to cut 5b is set in the second direction D2 such that the line to cut 5b passes through the metal wiring portion 26 between street portions 25 which are adjacent to each other in the second direction D2, while passing through the street portion 25 between the functional elements 23 adjacent to each other in the first direction D1. Here, in the circuit layer 22, a metal guard ring 27 is provided between the functional element 23 and the street portion 25. In FIG. 8, the illustration of the semiconductor substrate 21 on the surface layer of the laminated body 10 is omitted.

Here, the laminated body 10 includes a semiconductor wafer 20A including a functional element 23 as a semiconductor memory described later, and a semiconductor wafer 20B including a functional element 23 as a driver IC of the semiconductor memory, as the semiconductor wafer 20. Here, the laminated body 10 has one end 10a and the other end 10b in the lamination direction (third direction D3), and only the semiconductor wafer 20 constituting the one end 10a is the semiconductor wafer 20B. The other semiconductor wafer 20 including the semiconductor wafer 20 constituting the other end 10b is the semiconductor wafer 20A.

Subsequently, the laminated element 15 will be described. The laminated element 15 is mainly manufactured in a manner that the active region 11 is cut out by cutting the laminated body 10 along the above-described lines to cut 5a and 5b. Therefore, each laminated element 15 includes a plurality of semiconductor substrates 21 and circuit layers 22 (the same as the number of semiconductor wafers 20 in the laminated body 10) laminated in a line. In the laminated element 15, one circuit layer 22 includes one functional element 23.

Therefore, the entirety of the laminated element 15 includes functional elements 23 of which the number is equal to the number of circuit layers 22. The functional elements 23 are electrically connected to each other, for example, through through electrodes (not illustrated) formed in the semiconductor substrate 21 and the circuit layer 22. The functional element 23 includes a functional element for a semiconductor memory such as a DRAM and a functional element for a driver IC of the semiconductor memory. The through electrode is formed by, for example, a through-silicon via (TSV) structure. The through electrode is used for supplying power to the functional element 23 and the like of each layer (for example, the semiconductor memory and the driver IC). The laminated element 15 further includes, for example, a circuit (not illustrated) for performing high-speed wireless communication by magnetic field transmission, and signals may be transmitted and received using the circuit.

Figure 10:
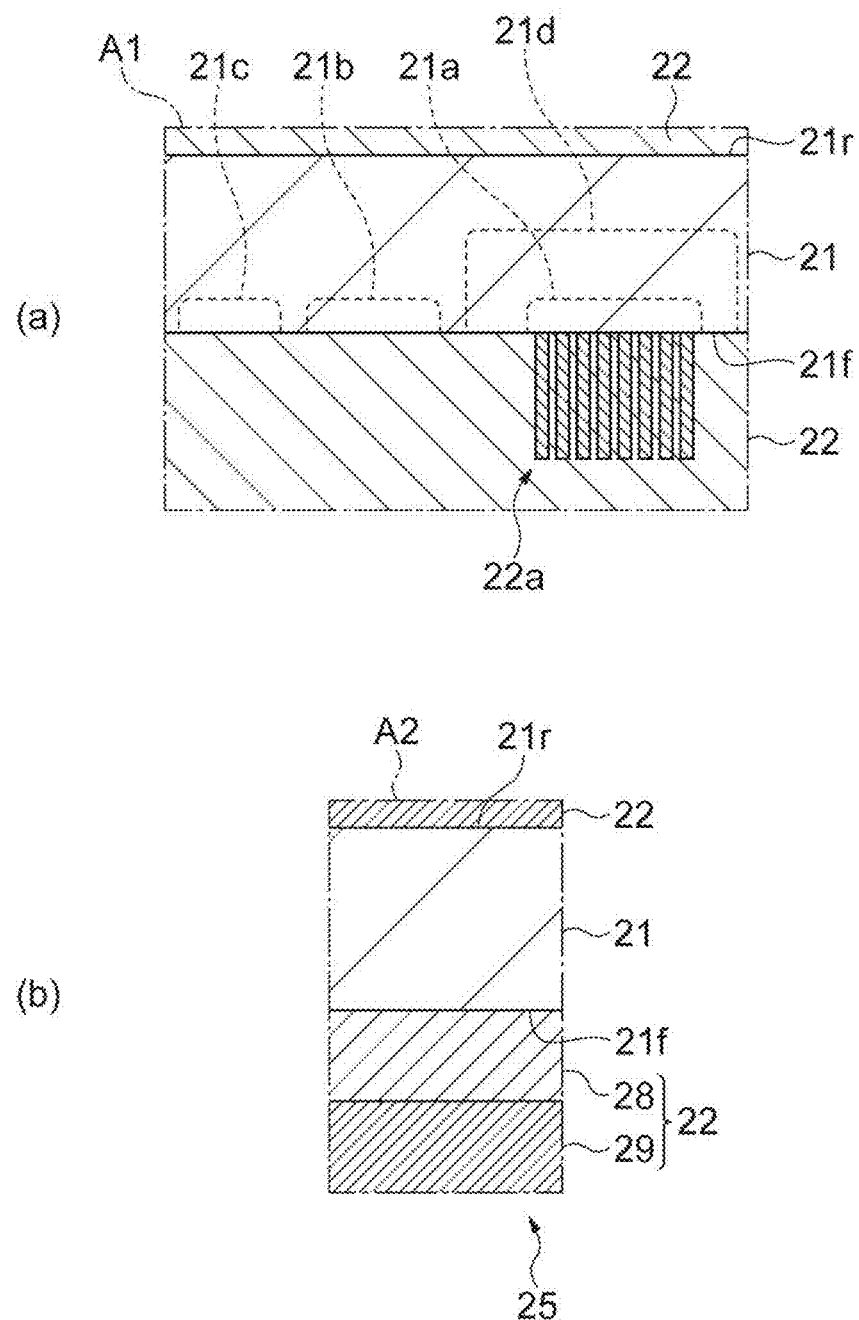
FIG. 10 is an enlarged view illustrating a partial region illustrated in FIG. 9.

(a) of FIG. 10 is an enlarged view illustrating a region A1 in FIG. 9, and is an enlarged sectional view illustrating the circuit layer 22 including the functional element 23 for the semiconductor memory and the corresponding semiconductor substrate 21. (b) of FIG. 10 is an enlarged view illustrating a region A2 in FIG. 9, and is an enlarged sectional view illustrating the street portion 25 and the corresponding semiconductor substrate 21. As illustrated in (a) of FIG. 10, the functional element 23 includes a plurality of memory cells 22a. The memory cell 22a and a region around the memory cell 22a are configured by, for example, an interlayer insulating film such as a $SiO_2$ film, a wiring layer, and the like. First conductive type regions (for example, P-well) 21a and 21b expanding from the front surface 21f towards the back surface 22r, a second conductive type region (for example, N-well) 21c, and a second conductive type region (for example, Deep N-well) 21d expanding to surround the first conductive type region 21a are formed at a portion of the semiconductor substrate 21, which corresponds to the functional element 23. The first conductive type region 21a is formed at a position corresponding to the memory cell 22a. The semiconductor substrate 21 is, for example, a silicon substrate.

As illustrated in (b) of FIG. 10, in the street portion 25, the circuit layer 22 includes insulating layers 28 and 29 which are sequentially laminated on the front surface 21f of the semiconductor substrate 21. The insulating layer 28 is made of, for example, silicon oxide (for example, $SiO_2$). The insulating layer 29 is made of, for example, silicon nitride (for example, SiN). A fracture 9 is formed in the cutting region 12 along each of the lines to cut 5a and 5b. The dimension of the laminated element 15 in the first direction D1 is, for example, about 10 mm. The dimension of the laminated element 15 in the second direction D2 is, for example, about 10 mm. The dimension of the laminated element 15 in the third direction D3 is, for example, about 300 μm.

Subsequently, steps of the laminated element manufacturing method according to the first embodiment will be described. First, the lamination step of forming the aforementioned laminated body 10 is performed. More specifically, first, a first wafer 30 is prepared as the semiconductor wafer 20B as illustrated in (a) of FIG. 11 (first bonding step). The circuit layer 22 of the first wafer 30 includes the functional elements 23 as the driver ICs. The circuit layer 22 of the first wafer 30 includes insulating layers 31 and 32 that are sequentially laminated on a front surface 21f in the street portion 25.

The insulating layer 31 is made of, for example, silicon oxide (for example, $SiO_2$). The insulating layer 32 is, for example, a Black Diamond type Low-k film. The thickness of the semiconductor substrate 21 of the semiconductor wafer 20B is about 600 μm to 800 μm, for example. The thickness of the circuit layer 22 of the semiconductor wafer 20B is from 3 µm to 13 µm, for example.

Figure 11:
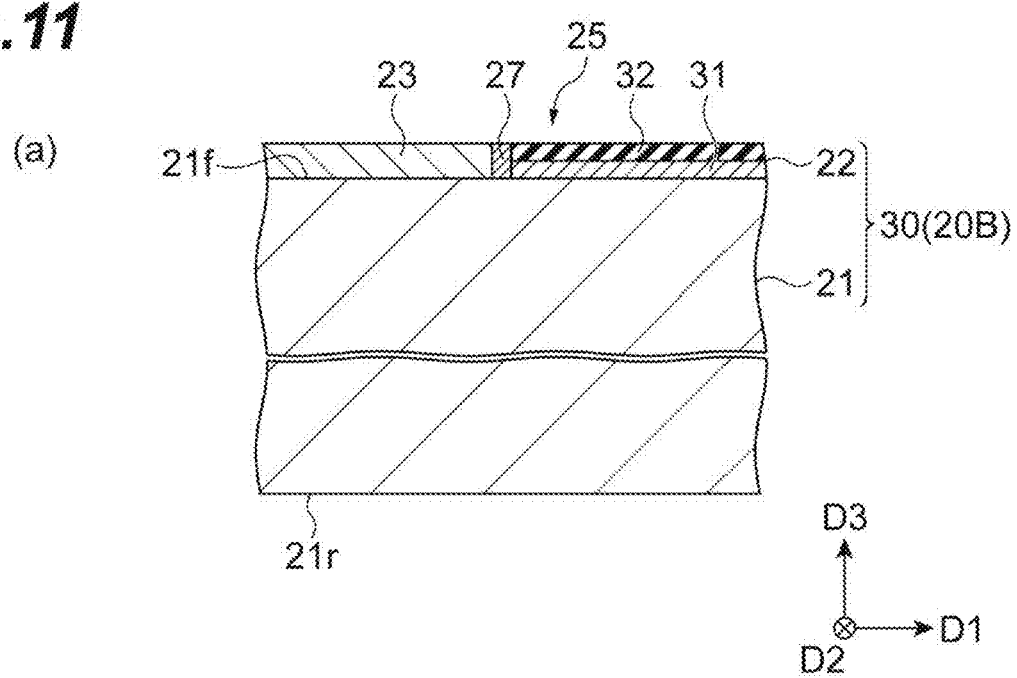
FIG. 11 is a diagram illustrating a main step of a laminated element manufacturing method according to a first embodiment.
Figure 11:
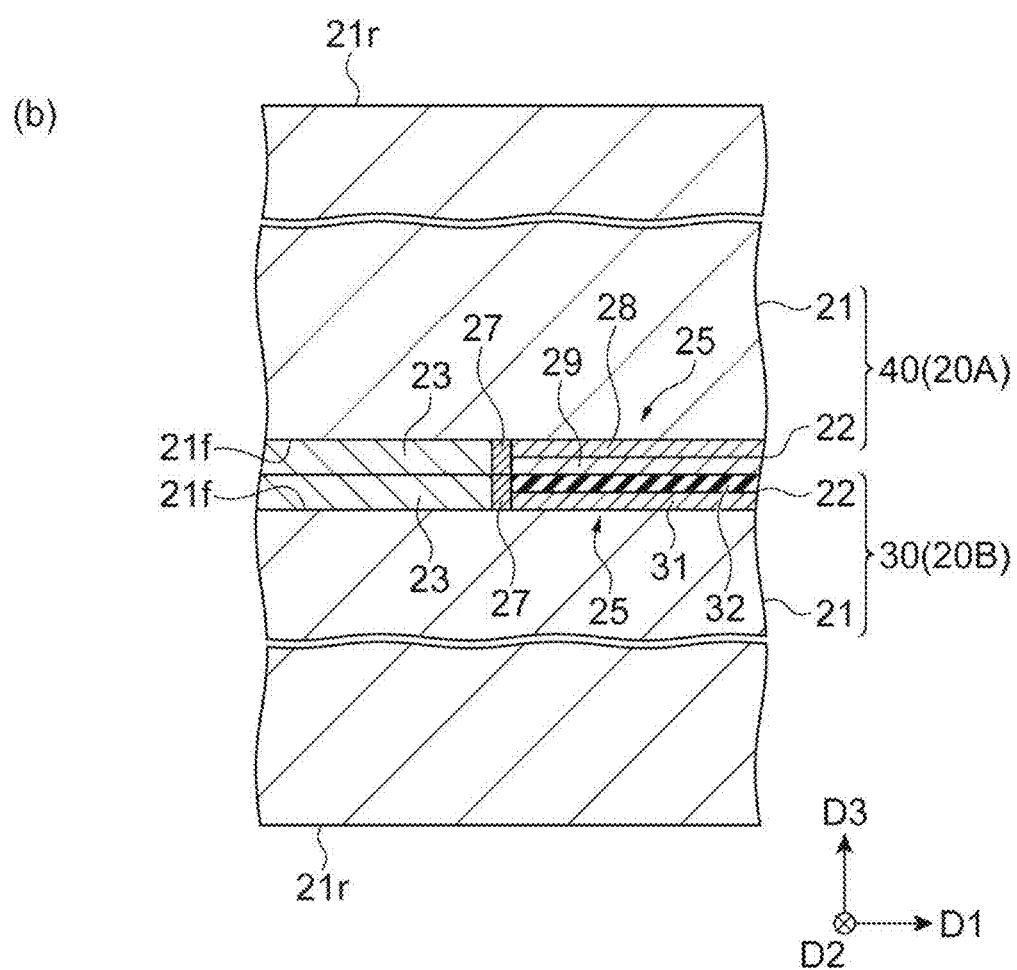

Then, as illustrated in (b) of FIG. 11, the semiconductor wafer (first wafer) 20A is prepared. The circuit layer 22 of the semiconductor wafer 20A includes the functional element 23 as the semiconductor memory. The circuit layer 22 of the semiconductor wafer 20A includes the insulating layers 28 and 29 in the street portion 25. The thickness of the semiconductor substrate 21 of the semiconductor wafer 20A is about 600 µm to 800 µm, for example. The thickness of the circuit layer 22 of the semiconductor wafer 20A is from 3 µm to 13 µm, for example.

Then, the circuit layer 22 of the semiconductor wafer 20A is directly bonded to the circuit layer 22 of the semiconductor wafer 20B. At this time, the functional elements 23 of the semiconductor wafer 20B correspond to the functional elements 23 of the semiconductor wafer 20A in the third direction D3 intersecting with the front surface 21f and the back surface 21r, respectively. That is, each of the functional elements 23 of the semiconductor wafer 20B and each of the functional elements 23 of the semiconductor wafer 20A are arranged side by side in the third direction D3 (in other words, facing each other in the third direction D3). An example of direct bonding includes room temperature bonding.

Figure 12:
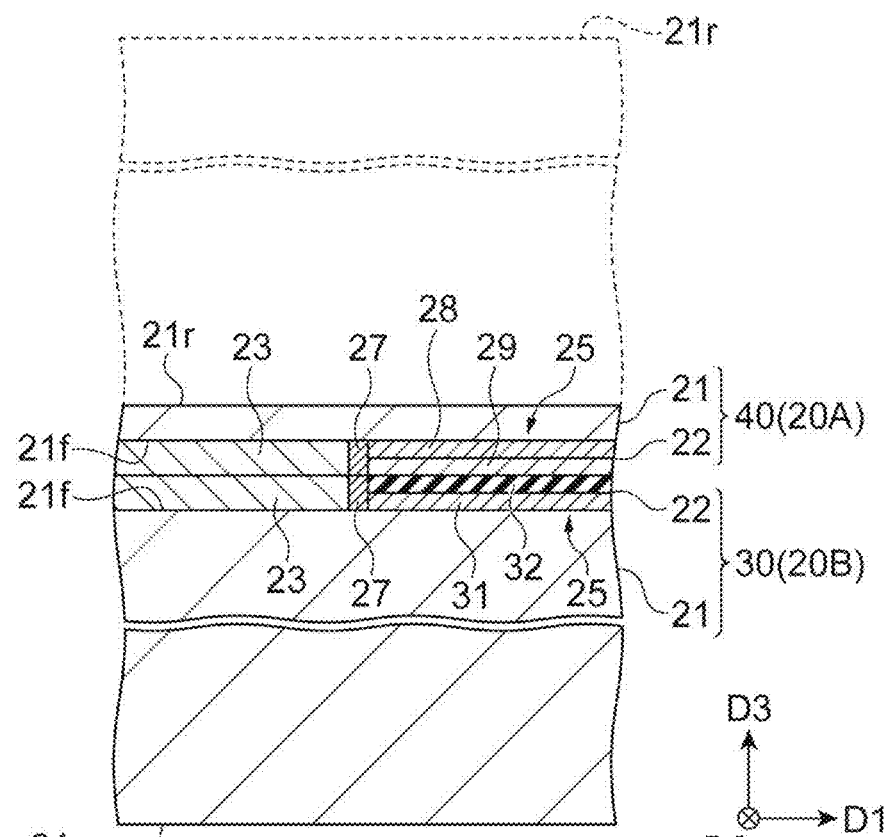
FIG. 12 is a diagram illustrating the main step of the laminated element manufacturing method according to the first embodiment.
Figure 12:
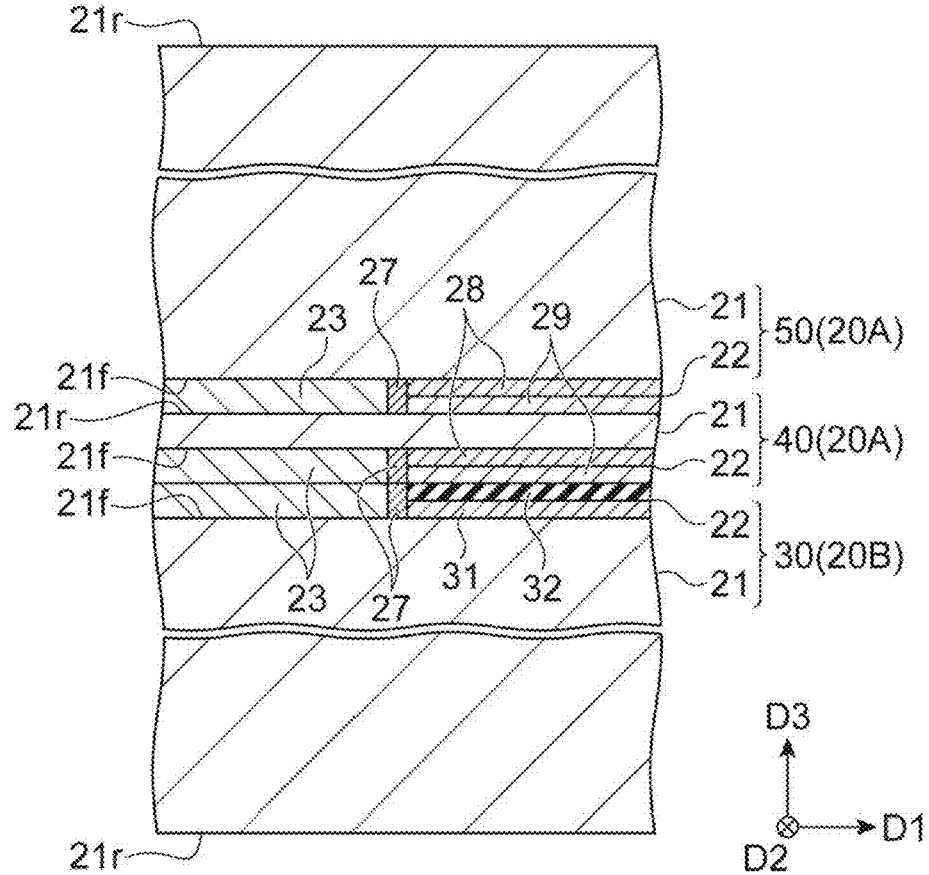

Subsequently, as illustrated in (a) of FIG. 12, the semiconductor substrate 21 of a second wafer 40 is ground (grinding step). Here, the semiconductor substrate 21 is ground from the rear surface 21r side, and the semiconductor substrate 21 (that is, the second wafer 40) is thinned. Here, for example, the semiconductor substrate 21 is ground such that a thickness of the semiconductor substrate 21 is about 3 µm or more and is about 13 µm or less (for example, is the same as a thickness of the circuit layer 22). Accordingly, the entire thickness of the second wafer 40 is set to be, for example, about 6 µm or more and about 26 µm or less. A new rear surface 21r formed by this grinding has flatness with which direct bonding can be performed (for example, the new rear surface is mirror-finished).

Subsequently, a third wafer 50 is prepared as the semiconductor wafer 20A as illustrated in (b) of FIG. 12 (second bonding step). Subsequently, the third wafer 50 is bonded to the second wafer 40 (second bonding step). Here, the circuit layer 22 of the third wafer 50 is directly bonded to the semiconductor substrate 21 of the second wafer 40. At this time, the respective functional elements 23 of the second wafer 40 and the respective functional elements 23 of the third wafer 50 correspond to each other along the third direction D3.

Subsequently, as illustrated in (a) of FIG. 13, the semiconductor substrate 21 of the third wafer 50 is ground from the rear surface 21r side, and the semiconductor substrate 21 (that is, the third wafer 50) is thinned. Here, as in the case of the second wafer 40, for example, the semiconductor substrate 21 is ground such that a thickness of the semiconductor substrate 21 is about 3 µm or more and about 13 µm or less (for example, is the same as the thickness of the circuit layer 22). Accordingly, the entire thickness of the third wafer 50 is set to be, for example, about 6 µm or more and about 26 µm or less. A new rear surface 21r formed by this grinding has flatness with which direct bonding can be performed (for example, the new rear surface is mirror-finished).

Figure 13:
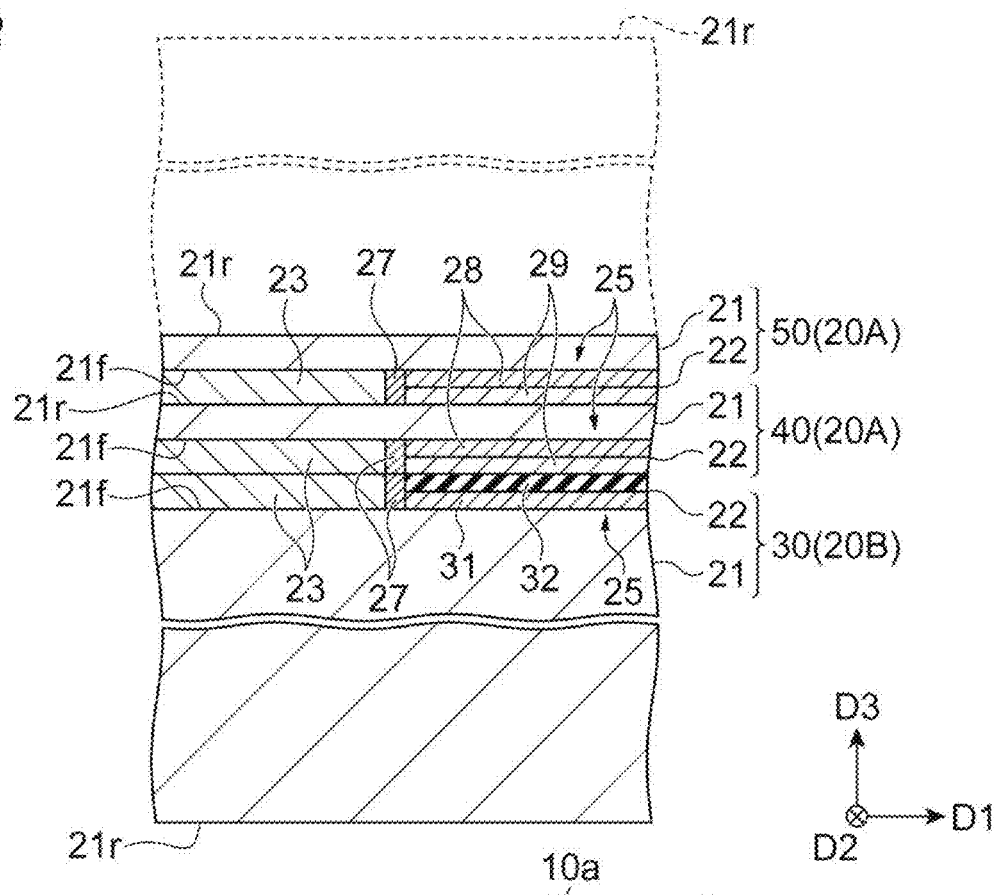
FIG. 13 is a diagram illustrating the main step of the laminated element manufacturing method according to the first embodiment.
Figure 13:
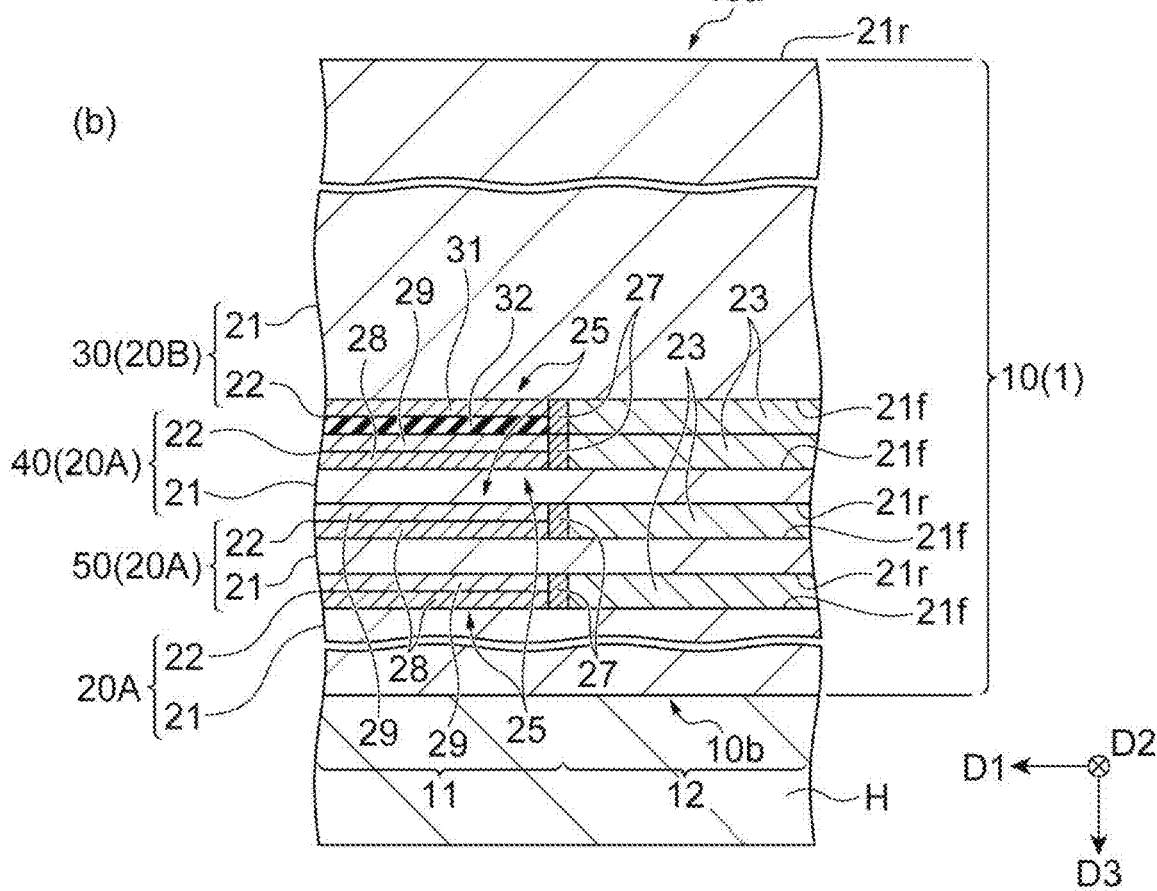

Thereafter, as illustrated in (b) of FIG. 13, the plurality of (for example, seven) semiconductor wafers 20A are sequentially laminated, bonded, and ground as in the second bonding step, and thus, the laminated body 10 is formed.

Accordingly, for example, the laminated body 10 including the plurality of (for example, ten) semiconductor wafers 20 is obtained by laminating one semiconductor wafer 20A (first wafer 30) including the functional elements 23 as the driver ICs and the plurality of (for example, nine) semiconductor wafers 20B (the second wafer 40, the third wafer 50, and the subsequent wafers) including the functional elements 23 as the semiconductor memories.

In (b) of FIG. 13, the laminated body 10 obtained as described above is held by a holder H in an inverted state in preparation for the subsequent laser light irradiation step. That is, here, the other end 10b of the laminated body 10 faces the holder H side, the first wafer 30 including one end 10a is located on the most opposite side to the holder H, and the rear surface 21r of the semiconductor substrate 21 is exposed. In the description of the subsequent steps, the laminated structure of the laminated body 10 is omitted, and the active region 11 and the cut region 12 are representatively illustrated.

Figure 14:
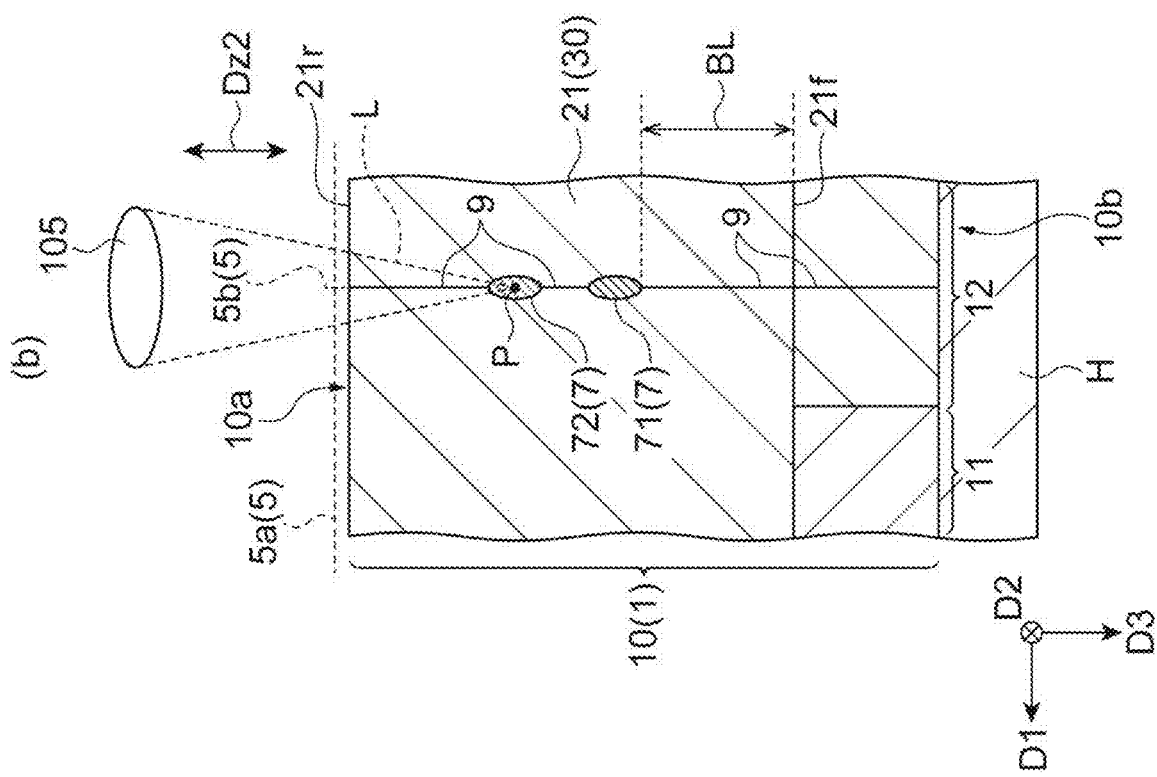
FIG. 14 is a diagram illustrating the main step of the laminated element manufacturing method according to the first embodiment.
Figure 14:
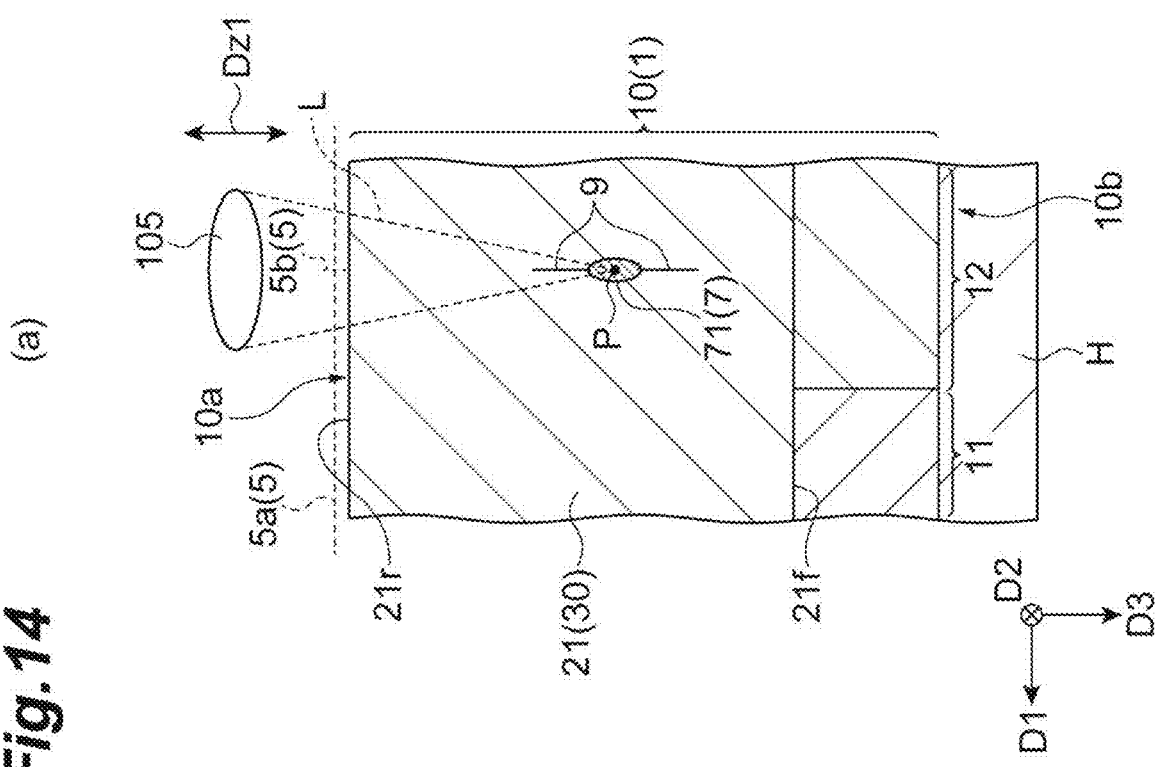

Subsequently, the laser light irradiation step of forming the modified region 7 and a fracture 9 in the laminated body 10 is performed by irradiating the laminated body 10 with the laser light L. That is, as illustrated in FIG. 14, the semiconductor substrate 21 of the first wafer 30 is irradiated with the laser light L along the lines to cut 5a and 5b set so as to pass between the functional elements 23. Thus, the modified region 7 is formed along the lines to cut 5a and 5b, and the fracture 9 extends from the modified region 7 along the laminating direction (third direction D3) of the laminated body 10. This step will be described in more detail.

In this step, first, as illustrated in (a) of FIG. 14, the focusing point P of the laser light L is located within the semiconductor substrate 21 of the first wafer 30 while the rear surface 21r of the semiconductor substrate 21 of the first wafer 30 is used as the laser light incident surface. In this state, the focusing point P of the laser light is relatively moved (scanned) along the lines to cut 5a and 5b while irradiating the semiconductor substrate 21 of the first wafer 30 with the laser light L. Accordingly, a first modified region 71 as the modified region 7 is formed within the semiconductor substrate 21 of the first wafer 30 along the lines to cut 5a and 5b. Further, the fracture 9 generated from the first modified region 71 partially extends along the third direction D3.

Subsequently, as illustrated in (b) of FIG. 14, the focusing point P of the laser light L is located within the semiconductor substrate 21 of the first wafer 30 while the rear surface 21r of the semiconductor substrate 21 of the first wafer 30 is used as the laser light incident surface. At this time, the position of the focusing point P is set on the rear surface 21r side (laser light incident surface side) from the position of the focusing point P when the first modified region 71 is formed. In this state, the focusing point P of the laser light L is relatively moved (scanned) along the lines to cut 5a and 5b while irradiating the semiconductor substrate 21 of the first wafer 30 with the laser light L.

Accordingly, a second modified region 72 as the modified region 7 is formed within the semiconductor substrate 21 of the first wafer 30 along the lines to cut 5a and 5b. Here, the second modified region 72 is formed between the first modified region 71 and the rear surface 21r so as to correspond to a difference in the position of the focusing point P. The second modified region 72 is formed, and thus, the fracture 9 further extends along the third direction D3 such that the fracture 9 reaches both ends (one end 10a and the other end 10b) of the laminated body 10 (that is, a so-called full-cut state). An irradiation condition of the laser light L at this time will be described in detail below.

As stated above, here, the modified region 7 is formed such that the fracture 9 reaches both ends of the laminated body 10 in the laminating direction (third direction D3). That is, in the laser light irradiation step, the first modified region 71 as the modified region 7 is formed by irradiating the semiconductor substrate 21 of the first wafer 30 with the laser light L from the rear surface 21r side (first laser light irradiation step). The semiconductor substrate 21 of the first wafer 30 is irradiated with the laser light L from the rear surface 21r side, and the second modified region 72 as the modified region 7 is formed between the first modified region 71 and the rear surface 21r. Accordingly, the fracture 9 extends so as to reach both ends of the laminated body 10 (second laser light irradiation step).

Subsequently, as illustrated in (a) of FIG. 15, the semiconductor substrate 21 of the first wafer 30 is ground from the rear surface 21r side, and thus, the modified regions 7 (the first modified region 71 and the second modified region 72) are removed (modified region removal step). Here, for example, the semiconductor substrate 21 is ground such that the thickness of the semiconductor substrate 21 is about 200 µm. The reason why the thickness of the semiconductor substrate 21 of the first wafer 30 remains thicker than the other semiconductor substrates 21 is that the semiconductor substrate 21 of the first wafer 30 serves as a support substrate in the laminated element 15.

Figure 15:
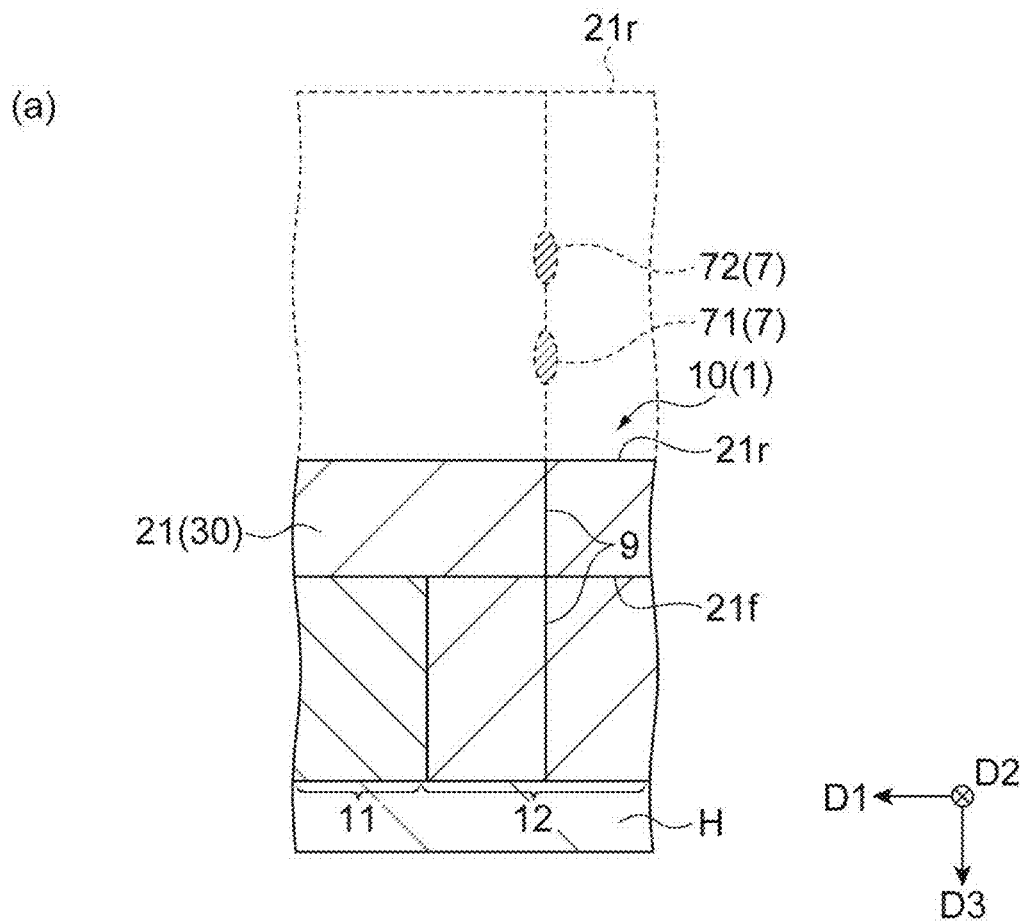
FIG. 15 is a diagram illustrating the main step of the laminated element manufacturing method according to the first embodiment.
Figure 15:
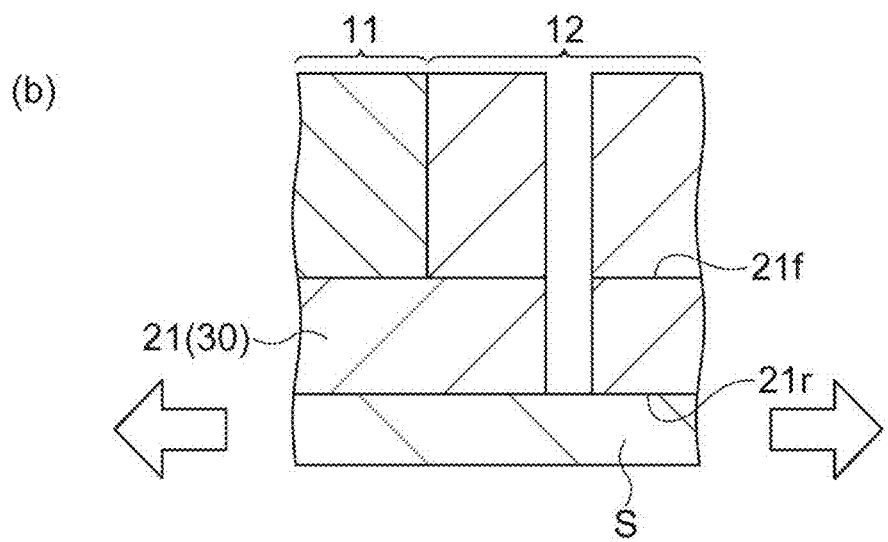

Thereafter, as illustrated in (b) of FIG. 15, the laminated body 10 is supported by an expandable support member S such as an expanded tape. At this time, the rear surface 21r of the semiconductor substrate 21 of the first wafer 30 is disposed on the support member S side. In that state, the laminated body 10 is cut along the lines to cut 5a and 5b by expanding the support member S to apply stress to the laminated body 10 in a direction in which the fracture 9 opens (cutting step). Accordingly, the active region 11 is cut out from the laminated body 10, and a plurality of laminated elements 15 is obtained. The plurality of laminated elements 15 obtained by cutting the laminated body 10 along the lines to cut 5a and 5b is separated from each other, and each laminated element 15 is picked up (pickup step).

As described above, in the manufacturing method of the laminated element 15 according to the first embodiment, the grinding step of grinding and thinning the semiconductor substrate of the semiconductor wafer 20 is performed when the laminated body 10 of the semiconductor wafer 20 is formed. Accordingly, the thin laminated body 10 can be obtained. As described above, when blade dicing is used for cutting the laminated body 10, a yield is significantly reduced due to chipping. In contrast, in this method, the semiconductor substrate 21 of the semiconductor wafer 20 is irradiated with the laser light L along the line to cut 5. Thus, the modified region 7 is formed and the fracture 9 extends from the modified region 7 in the laminating direction. Accordingly, the laminated body 10 can be cut while suppressing chipping at a bonding boundary between the semiconductor wafers 20. Therefore, according to this method, it is possible to achieve both the thickness reduction of the laminated element 15 and the improvement of the yield.

The manufacturing method of the laminated element 15 according to the first embodiment further includes the modified region removal step of removing the modified region 7 by grinding the semiconductor substrate 21 on which the modified region 7 is formed after the laser light irradiation step. Thus, bending strength is improved. Since the manufacturing method of the laminated element 15 according to the present embodiment further includes the cutting step of cutting the laminated body 10 along the lines to cut 5 by applying the stress to the laminated body 10 after the laser light irradiation step and the modified region removal step, the laminated body 10 can be reliably cut.

Here, in the manufacturing method of the laminated element 15 according to the first embodiment, in the laser light irradiation step, the modified regions 7 are formed such that the fracture 9 reaches the both ends (one end 10a and the other end 10b) of the laminated body 10 in the laminating direction (that is, the full cut of the laminated body 10 is caused). Therefore, the laser light irradiation step includes the first laser light irradiation step of forming the first modified region 71 as the modified region 7 by irradiating the semiconductor substrate 21 with the laser light L from the rear surface 21r side and the second laser light irradiation step of extending the fracture 9 such that the fracture reaches both ends of the laminated body 10 by irradiating the semiconductor substrate 21 with the laser light L from the rear surface 21r to form the second modified region 72 as the modified region 7 between the first modified region 71 and the rear surface 21r.

These steps will be described in detail. In the laser light irradiation step illustrated in FIG. 14, the irradiation condition of the laser light L for causing the full cut of the laminated body 10 can be controlled. Here, a case where the semiconductor substrate 21 is made of silicon will be described. In order to cause the full cut of the laminated body 10, first, in a state in which a distance (hereinafter, referred to as a "lower end distance BL") between the front surface 21s opposite to the rear surface 21r which is the laser light incident surface in the semiconductor substrate 21 and the end portion of the first modified region 71 on the front surface 21s side is increased to some extent, and when the second modified region 72 is formed, the fracture 9 (initial fracture) extending from the first modified region 71 to the front surface 21s side reaches the front surface 21s.

Here, for example, the initial fracture reaches the front surface 21s in a state in which the lower end distance BL is set to be 200 µm or more with respect to the semiconductor substrate 21 having a thickness of 775 µm. Accordingly, the fracture 9 further extends to the end of the laminated body 10 due to the influence of the initial fracture that extends by 200 µm or more and reaches the front surface 21s, and thus, the full cut of the laminated body 10 is caused. Thus, a wavelength of the laser light L can be set in a range of 1170 nm or more and 1800 nm or less.

When the wavelength of the laser light L is 1170 nm or more, internal transmittance of the laser light L is theoretically 100% in non-doped and defect-free ideal silicon. Meanwhile, when the wavelength of the laser light L is 1800 nm or less, the modified regions 7 can be formed by reliably generating two-photon absorption in the semiconductor substrate 21. The full cut of the laminated body 10 can be more reliably caused by setting a pulse width of the laser light L to be 350 nsec or more, a pulse energy to be 25 µJ or more, and a pulse pitch to be 6.5 µm or more and 45 µm or less.

An example of the irradiation condition of the laser light L in which the initial fracture extending from the first modified region 71 having a lower end distance BL of 200 µm or more reaches the front surface 21s (that is, an example of a condition in which the full cut of the laminated body 10 can be caused) is illustrated.

First Example

Wavelength of laser light L: 1500 nm.
Pulse width: 500 nsec.

Pulse frequency: 40 kH.
Output value under condensing lens 105: 1.48 w.
Pulse energy: 37.0 µJ.
Pulse pitch: 15 µm.
Thickness of semiconductor substrate 21: 779 µm.
Distance (lower end distance BL) from front surface 21s of first modified region 71: 262 µm.
Distance from front surface 21s of second modified region 72: 370 µm.
Movement distance Dz1 of condensing lens 105 when first modified region 71 is formed: 142 µm.
Movement distance Dz2 of condensing lens 105 when second modified region 72 is formed: 112 µm.

Second Example

Wavelength of laser light L: 1342 nm.
Pulse width: 350 nsec.
Pulse frequency: 60 kH.
Output value under condensing lens 105: 2.60 w.
Pulse energy: 43.3 µJ.
Pulse pitch: 8.30 µm.
Thickness of semiconductor substrate 21: 625 µm
Distance from front surface 21s of first modified region 71 (lower end distance BL): 218 µm.
Distance from front surface 21s of second modified region 72: 346 µm.
Movement distance Dz1 of condensing lens 105 when first modified region 71 is formed: 92 µm.
Movement distance Dz2 of condensing lens 105 when second modified region 72 is formed: 60 µm.

The movement distance Dz1 is a distance obtained by moving the condensing lens 105 along the third direction D3 such that the focusing point P is formed at a position for forming the first modified region 71 from an initial position of the condensing lens 105 that forms the focusing point P on the rear surface 21r (laser light incident surface) of the semiconductor substrate 21 (see (a) of FIG. 14). Similarly, the movement distance Dz2 is a distance obtained by moving the condensing lens 105 along the third direction D3 such that the focusing point is fouued at a position for forming the second modified region 72 from the initial position (see (b) of FIG. 14).

As described above, the full cut of the laminated body 10 is caused, and thus, it is possible to reliably cut the laminated body 10. Accordingly, it is possible to further improve the yield. The warpage of the laminated body 10 can be suppressed. The warpage of the laminated body 10 is suppressed, and thus, the semiconductor substrate 21 can be ground so as to remove the modified region 7 as described above. Accordingly, bending strength is improved.

Here, also from a viewpoint different from the aforementioned viewpoint, the lower end distance BL can be set to be 200 µm or more. That is, when the lower end distance BL is reduced, there is a concern that damage will be caused on the front surface 21s side due to leakage light to the front surface 21s side opposite to the rear surface 21r which is the laser light incident surface of the semiconductor substrate 21. As stated above, the damage caused on the surface opposite to the laser light incident surface is referred to as "splash damage". FIG. 16 is a table representing a relationship between the lower end distance and the splash damage. In the example of FIG. 16, an Sn film was formed on an end surface (front surface 21s) opposite to the laser light incident surface of the semiconductor substrate 21, and the splash damage was observed.

"YES" and "NO" in a "DAMAGE" column in the table of FIG. 16 indicate whether or not there is damage at a position (a position corresponding to the line to cut 5) immediately below the focusing point P of the laser light L, and a "DISTANCE" column indicates a maximum distance from the position to a position at which the splash damage is caused. As represented in FIG. 16, when the lower end distance BL is 107 µm or more, the damage at the position immediately below the focusing point P is not caused. Meanwhile, a threshold value of the lower end distance BL for determining whether or not the splash damage is caused is between 189 µm and 220 µm. As stated above, also from the viewpoint of reducing the splash damage, the lower end distance BL can be set to be 200 µm or more. Accordingly, it is possible to suppress deterioration of device characteristics.

Second Embodiment

Figure 17:
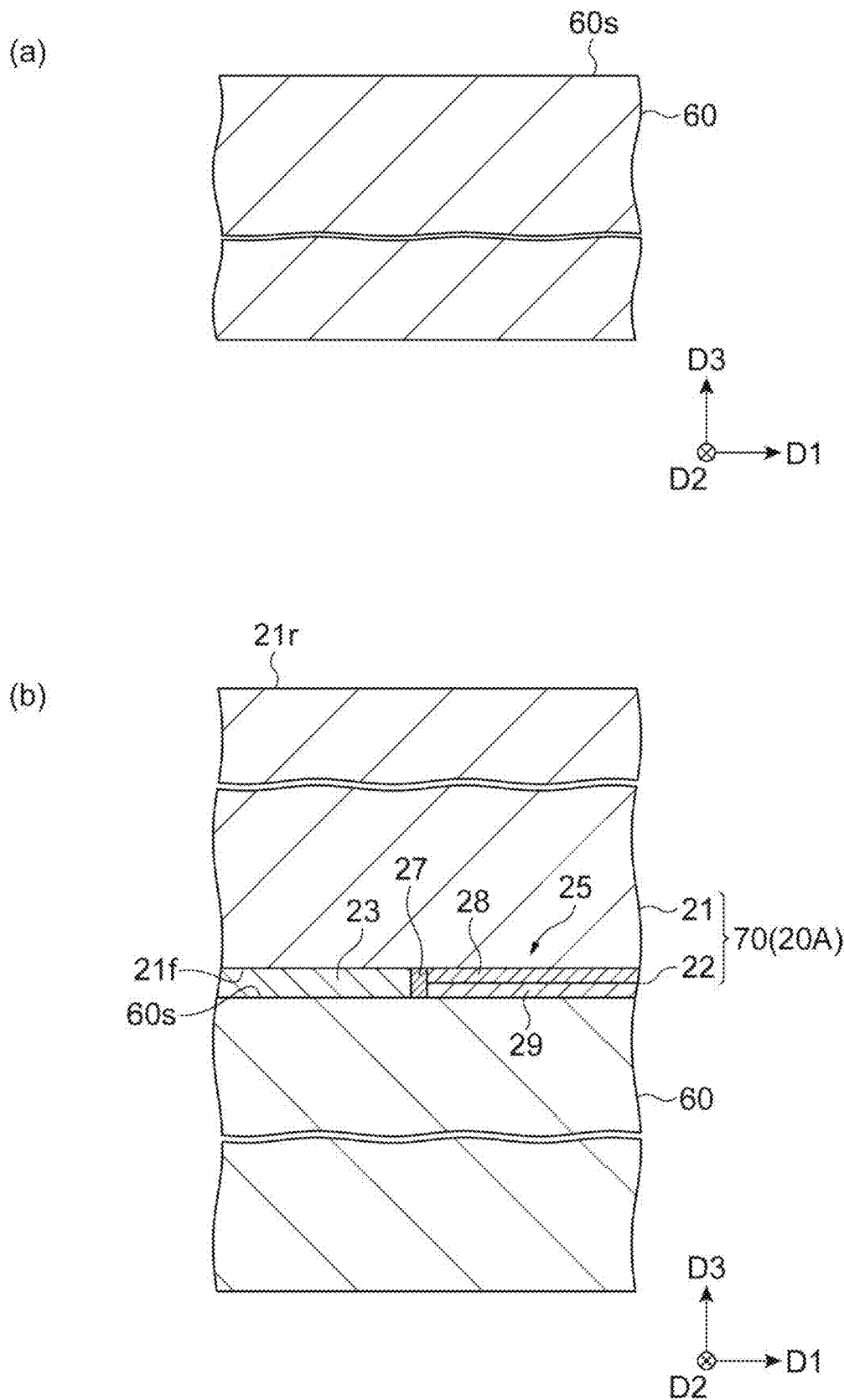
FIG. 17 is a diagram illustrating main steps of another aspect of the laminated element manufacturing method.

Subsequently, an example of a laminated element manufacturing method according to a second embodiment will be described. In this manufacturing method, a preparation step is performed before a lamination step of forming the laminated body of the semiconductor wafer 20. That is, here, first, a support substrate 60 is prepared as illustrated in (a) of FIG. 17 (preparation step). The support substrate 60 is any substrate such as a glass substrate or a semiconductor substrate. The support substrate 60 has, for example, the same thickness (for example, a thickness of about 600 µm or more and 800 µm or less) as the thickness of the unground semiconductor substrate 21. Subsequently, a first wafer 70 is prepared as a semiconductor wafer 20A as illustrated in (b) of FIG. 17 (preparation step). Subsequently, the circuit layer 22 of the first wafer 70 is bonded to a front surface 50a of the support substrate 60 (preparation step). For example, resin bonding can be used as this bonding.

Figure 18:
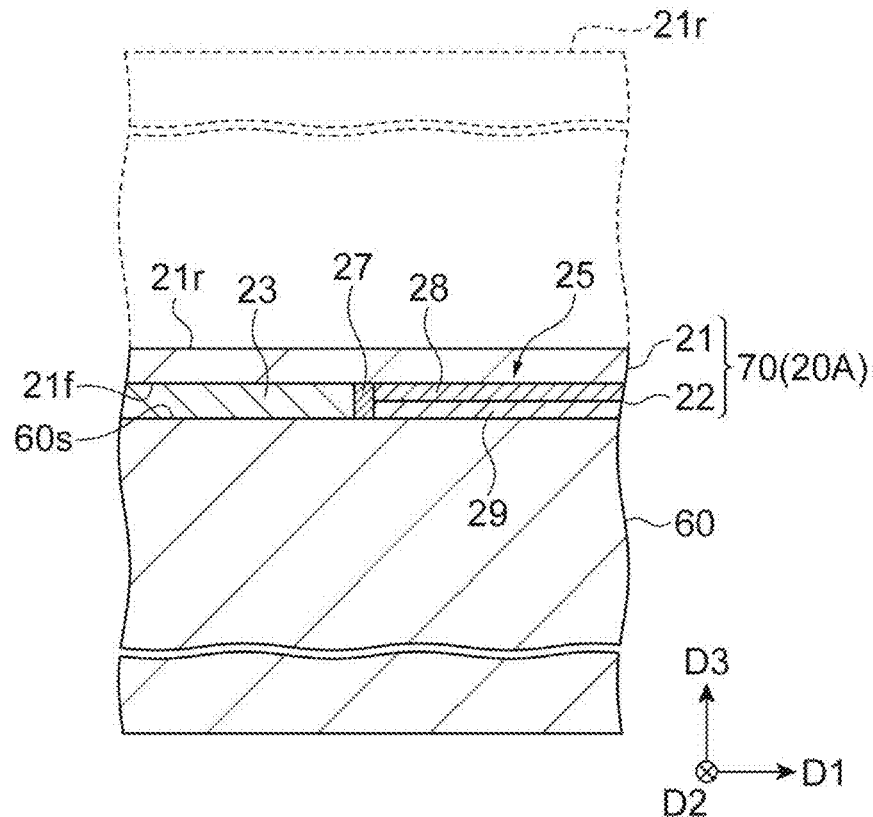
FIG. 18 is a diagram illustrating main steps of still another aspect of the laminated element manufacturing method.
Figure 18:
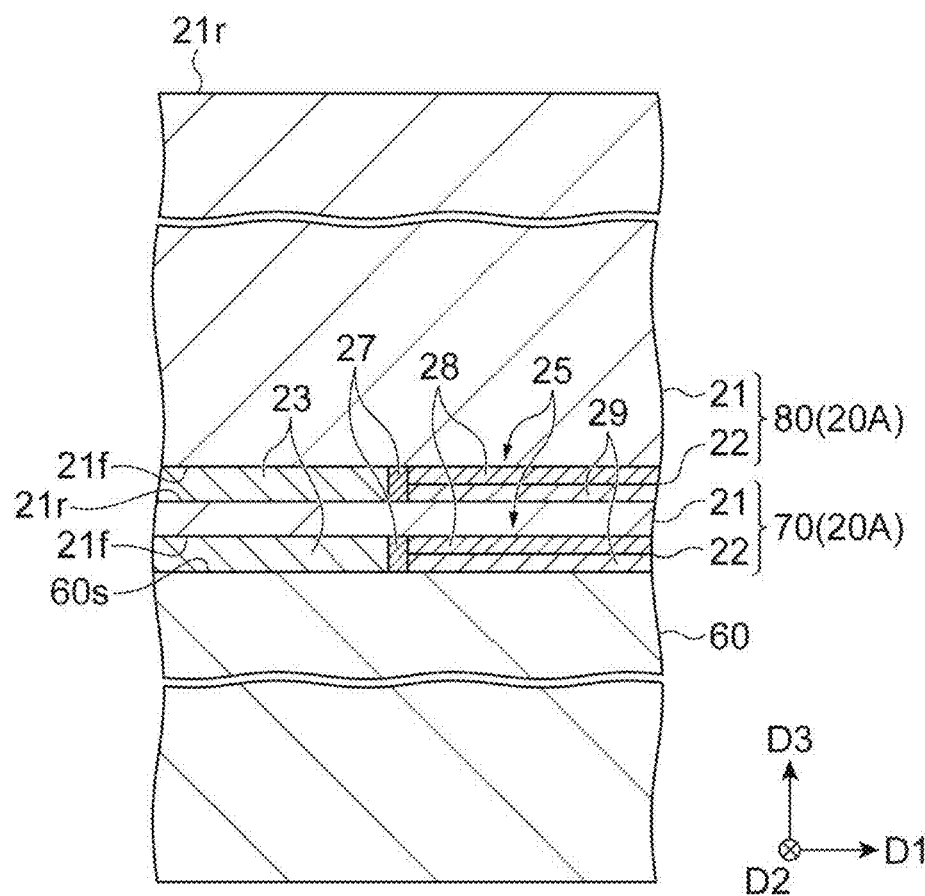

Subsequently, as illustrated in (a) of FIG. 18, the semiconductor substrate 21 of the first wafer 70 is ground. Here, the semiconductor substrate 21 is ground from the back surface 21r side, and thus the semiconductor substrate 21 (that is, the first wafer 70) is thinned. Here, for example, the semiconductor substrate 21 is ground such that the thickness of the semiconductor substrate 21 is about from 3 µm to 13 µm (as an example, the thickness is substantially equal to the thickness of the circuit layer 22). Thus, the total thickness of the first wafer 70 is set to, for example, about 6 µm to 26 µm. The new back surface 21r formed by the grinding is flat enough to allow direct bonding (as an example, the back surface is mirrored).

Subsequently, the laminating step is performed. That is, a second wafer 80 is prepared as the semiconductor wafer 20A as illustrated in (b) of FIG. 18 (first bonding step). At the same time, the first wafer 70 bonded to the support substrate 60 is prepared as described above (first bonding step). Subsequently, the second wafer 80 is bonded to the first wafer 70 (first bonding step). Here, the circuit layer 22 of the second wafer 80 is directly bonded to the semiconductor substrate 21 of the first wafer 70. At this time, the respective functional elements 23 of the first wafer 70 and the respective functional elements 23 of the second wafer 80 correspond to each other along the third direction D3.

Figure 19:
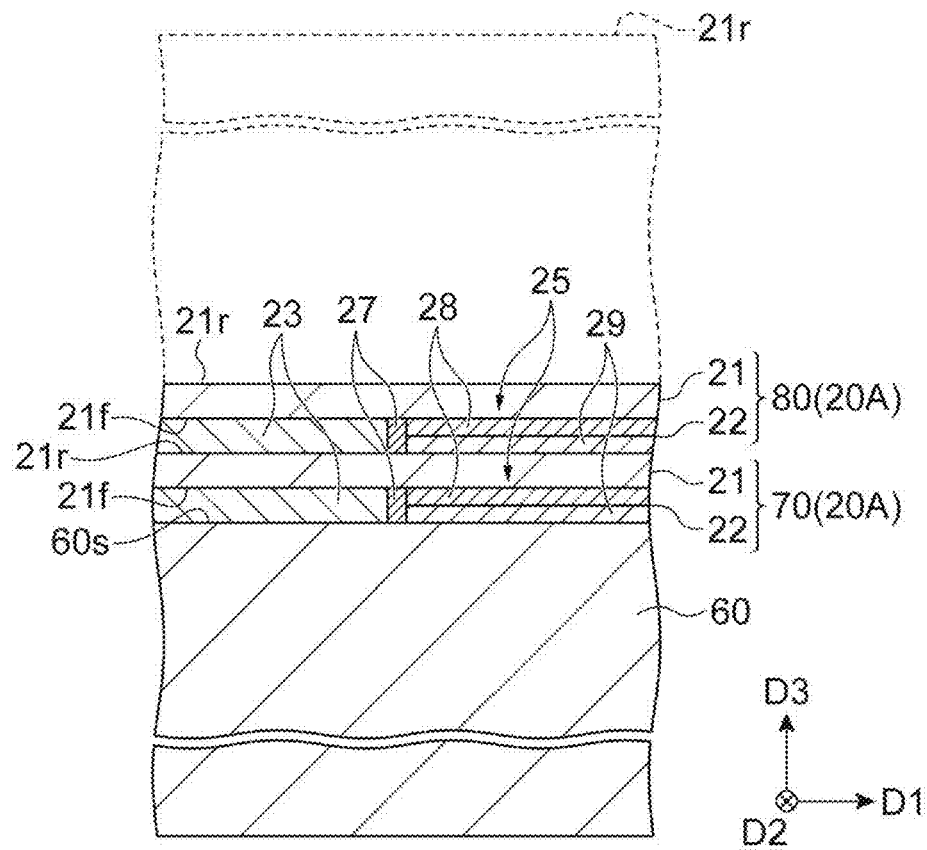
FIG. 19 is a diagram illustrating main steps of still another aspect of the laminated element manufacturing method.
Figure 19:
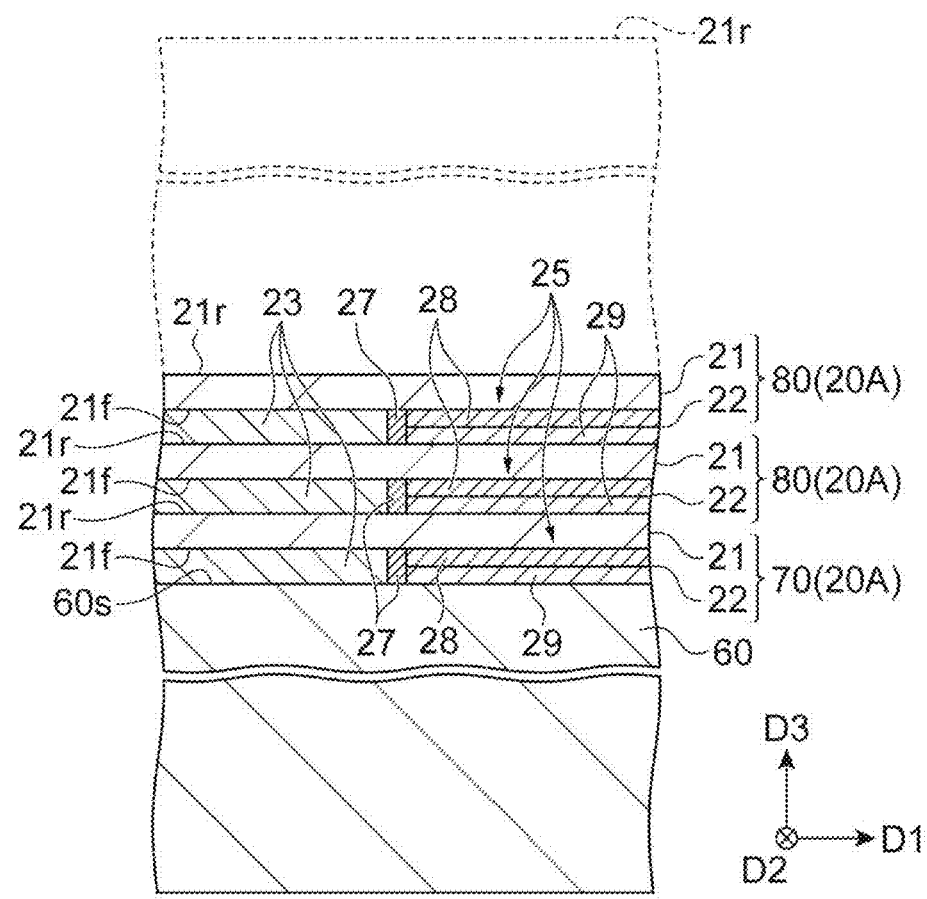

Subsequently, the semiconductor substrate 21 of the second wafer 80 is ground as illustrated in (a) of FIG. 19 (grinding step). Here, the semiconductor substrate 21 is ground from the rear surface 21r side, and the semiconductor substrate 21 (that is, the second wafer 80) is thinned. Here, as in the case of the first wafer 70, for example, the semiconductor substrate 21 is ground such that the thickness of the semiconductor substrate 21 is about 3 µm or more and about 13 µm or less (for example, is the same as thickness of the circuit layer 22). Accordingly, the entire thickness of the second wafer 80 is set to be, for example, about 6 µm or more and about 26 µm or less. A new rear surface 21r formed by this grinding has flatness with which direct bonding can be performed (for example, the new rear surface is mirror-finished).

Figure 20:
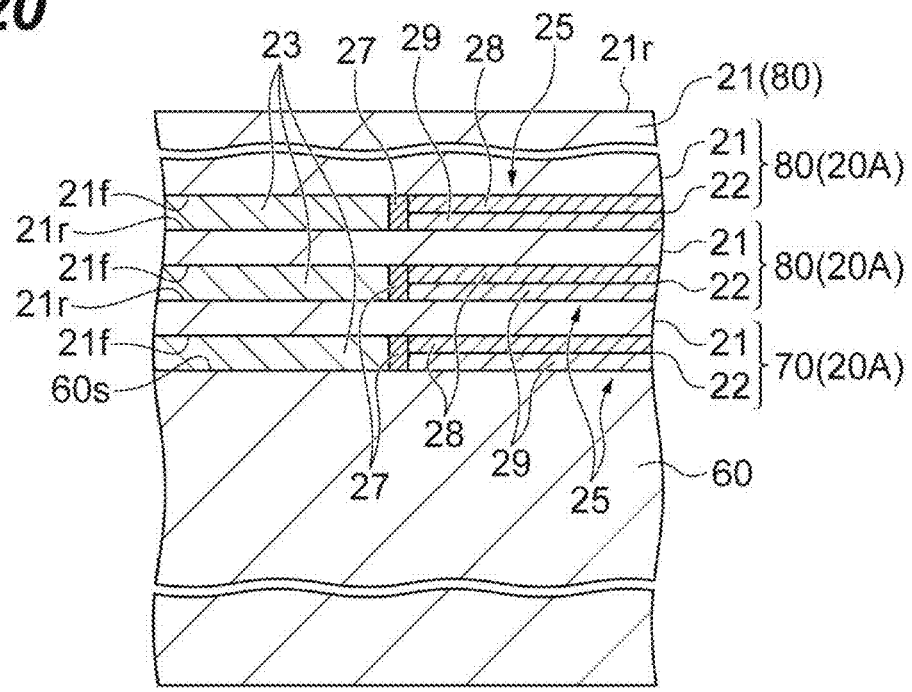
FIG. 20 is a diagram illustrating main steps of still another aspect of the laminated element manufacturing method.
Figure 20:
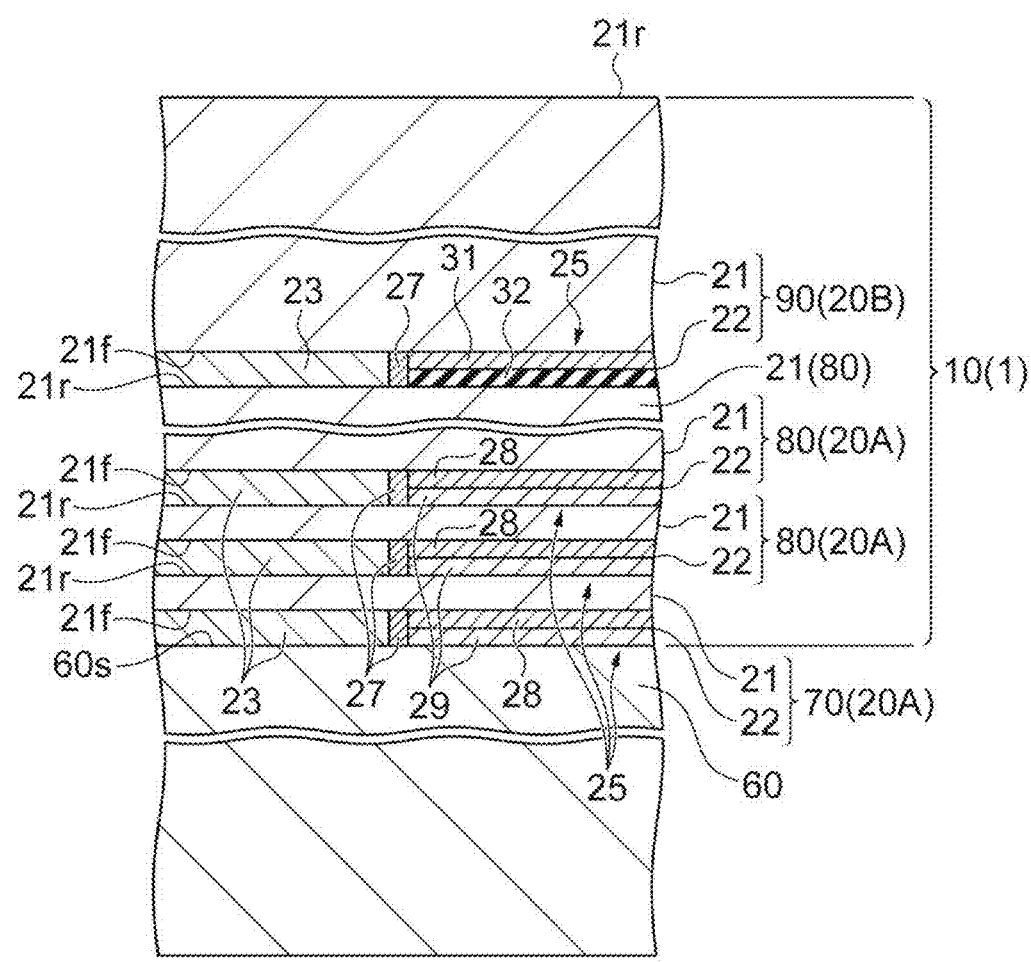

Subsequently, as illustrated in (b) of FIG. 19 and (a) of FIG. 20, the laminated body including the plurality of (here, nine) semiconductor wafers 20A laminated on the support substrate 60 is formed by repeatedly laminating, bonding, and grinding the second wafer 80 as the semiconductor wafer 20A as in the above-described first bonding step and the grinding step.

Subsequently, as illustrated in (b) of FIG. 20, a third wafer 90 is prepared as the semiconductor wafer 20B, and the circuit layer 22 of the third wafer 90 is directly bonded to the semiconductor substrate 21 of the second wafer 80 such that the respective functional elements 23 of the second wafer 80 and the respective functional elements 23 of the third wafer 90 correspond to each other (second bonding step). Accordingly, the laminated body 10 according to the present embodiment is obtained. The laminated body 10 mentioned herein is different from the laminated body 10 according to the first embodiment in that the semiconductor substrates 21 and the circuit layers 22 are alternately laminated over the entire laminated body 10.

Thereafter, as in the laser light irradiation step according to the first embodiment, a laser light irradiation step of forming the modified regions 7 (the first modified region 71 and the second modified region 72) and the fracture 9 in the laminated body 10 by irradiating the laminated body 10 with the laser light L is performed as illustrated in FIG. 14. However, in the present embodiment, the modified region 7 is formed along the lines to cut 5a and 5b and the fracture 9 extends from the modified region 7 in the laminating direction (third direction D3) of the laminated body 10 by irradiating the semiconductor substrate 21 of the third wafer 90 with the laser light L along the lines to cut 5a and 5b set so as to pass between the functional elements 23.

In this case, the modified region 7 is formed such that the fracture 9 reaches both ends (one end 10a and the other end 10b) of the laminated body 10 in the laminating direction. As in the cutting step according to the first embodiment, a cutting step of cutting the laminated body 10 along the lines to cut 5a and 5b by applying stress to the laminated body 10 in the direction in which the fracture 9 opens is performed as illustrated in FIG. 15. Accordingly, the plurality of laminated elements 15 is cut out from the laminated body 10. A pickup step is performed as in the first embodiment. The laminated element manufacturing method according to the present embodiment may further include a support substrate removal step of removing the support substrate 60 from the laminated body 10 after the laminating step and before the laser light irradiation step or after the laser light irradiation step. However, the support substrate removal step is performed before the cutting step. In the laminated element manufacturing method according to the second embodiment, it is also possible to achieve the same effects as the effects according to the first embodiment.

The aforementioned embodiments have been described in conjunction with one embodiment of the laminated element manufacturing method according to one aspect of the present invention. Therefore, the laminated element manufacturing method according to one aspect of the present invention is not limited to the aforementioned embodiments, and can be arbitrarily modified without departing from the gist of the claims.

For example, a gettering region 4 may be formed at a portion corresponding to the functional element 23 in the semiconductor substrate 21 (more specifically, a region of this portion on the rear surface 21r side with respect to the second conductivity region 21d) so as to be exposed to the rear surface 21r. The gettering region is a region that exhibits a gettering effect that collects and captures impurities such as heavy metals within the semiconductor substrate 21. The gettering region is a region in which the semiconductor substrate 21 is modified by laser light irradiation (a region in which density, refractive index, mechanical strength, and other physical characteristics are different from the surroundings), and is, for example, a melting treatment region. The gettering region 4 may be formed continuously or intermittently as long as the gettering region faces the functional element 23 (more specifically, the memory cell 22a).

When the gettering region is formed, the pulse width of the laser light can be shorter than the pulse width of the laser light L for forming the modified region 7. Accordingly, the gettering region which has a size less than the size of the modified region 7 and is more difficult to cause the fracture than the modified region 7 can be formed.

For example, the gettering region can be formed by the following procedure. That is, as illustrated in (b) of FIG. 11, after the second wafer 40 is laminated and bonded to the first wafer 30, the gettering region is formed by irradiating the semiconductor substrate 21 with the laser light with the rear surface 21r of the semiconductor substrate 21 of the second wafer 40 as the laser light incident surface. Thereafter, as illustrated in (a) of FIG. 12, the semiconductor substrate 21 is thinned while leaving the gettering region by grinding the semiconductor substrate 21. At this time, the gettering region is exposed on the rear surface 21r. Accordingly, the gettering region is formed at the portion corresponding to the functional element 23 in the semiconductor substrate 21 so as to be exposed to the rear surface 21r. Such a gettering forming step can be performed after each of the semiconductor wafer 20 is laminated and before the semiconductor wafer is ground.

In the aforementioned embodiments, when the two semiconductor wafers 20 are bonded, the respective functional elements 23 are laminated so as to correspond to each other. A case where the functional element 23 of one semiconductor wafer 20 and the functional element of the other semiconductor wafer 20 correspond to each other means that at least one functional element 23 of one semiconductor wafer 20 and at least one functional element 23 of the other semiconductor wafer 20 have a predetermined positional relationship in one active region 11. Therefore, for example, the memory cells 22a of the functional elements 23 are not limited to one-to-one correspondence, and may be in one-to-many correspondence. Even when the memory cells 22a are in one-to-one correspondence, the positions in the first direction D1 and the second direction D2 may be different from each other not only when the memory cells are arranged along the third direction D3.

In the above embodiments, an example in which the circuit layer 22 is directly bonded to the semiconductor substrate 21 or another circuit layer 22 has been described. In a case where the circuit layer 22 is directly bonded, flattening processing may be performed on the front surface of the circuit layer 22. However, the flattening processing may mean that a flattening film made of resin or the like is formed on the front surface of the circuit layer 22 in addition to a case where flattening processing is performed on an insulating film or the like of the front surface of the circuit layer 22. That is, the circuit layer 22 may be bonded to the semiconductor substrate 21 or the circuit layer 22 in a state where another film-like layer is interposed. Thus, the bonding of the circuit layer 22 is not limited to the example of the direct bonding described above.

INDUSTRIAL APPLICABILITY

It is possible to provide the laminated element manufacturing method capable of achieving both the thickness reduction of the laminated element and the improvement of the yield.

REFERENCE SIGNS LIST 5, 5a, 5b line to cut
7 modified region
9 fracture
10 laminated body
15 laminated element
20, 20A, 20B semiconductor wafer
21 semiconductor substrate
21s front surface
21r rear surface
22 circuit layer
23 functional element
30, 70 first wafer
40, 80 second wafer
50, 90 third wafer
60 support substrate
71 first modified region
72 second modified region
L laser light

The invention claimed is:

1. A laminated element manufacturing method comprising:
  a laminating step of forming a laminated body of a semiconductor wafer including a semiconductor substrate having a front surface and a rear surface and a circuit layer including a plurality of functional elements arranged in two-dimension along the front surface; and
  a laser light irradiation step of forming a modified region and a fracture in the laminated body by irradiating the laminated body with a laser light after the laminating step,
  wherein the laminating step includes
  a first bonding step of preparing, as the semiconductor wafer, a first wafer and a second wafer, and bonding the circuit layer of the second wafer to the circuit layer of the first wafer such that the respective functional elements of the first wafer and the respective functional elements of the second wafer correspond to each other,
  a grinding step of grinding the semiconductor substrate of the second wafer after the first bonding step, and
  a second bonding step of preparing a third wafer as the semiconductor wafer after the grinding step, and bonding the circuit layer of the third wafer to the semiconductor substrate of the second wafer such that the respective functional elements of the second wafer and the respective functional elements of the third wafer correspond to each other, and
  in the laser light irradiation step, the modified region is formed along a line to cut set to pass between the functional elements and the fracture extends from the modified region along a laminating direction of the laminated body by irradiating the semiconductor substrate of the first wafer with the laser light along the line to cut,
  wherein, in the laser light irradiation step, the modified region is formed such that the fracture reaches both ends of the laminated body in the laminating direction.

2. The laminated element manufacturing method according to claim 1,
  wherein the laser light irradiation step includes
  a first laser light irradiation step of forming, as the modified region, a first modified region by irradiating the semiconductor substrate with the laser light from the rear surface side, and
  a second laser light irradiation step of extending the fracture such that the fracture reaches the both ends by forming, as the modified region, a second modified region between the first modified region and the rear surface by irradiating the semiconductor substrate with the laser light from the rear surface side.

3. The laminated element manufacturing method according to claim 1, further comprising:
  a cutting step of cutting the laminated body along the line to cut by applying stress to the laminated body after the laser light irradiation step.

4. A laminated element manufacturing method comprising:
  a laminating step of forming a laminated body of a semiconductor wafer including a semiconductor substrate having a front surface and a rear surface and a circuit layer including a plurality of functional elements arranged in two-dimension along the front surface;
  a laser light irradiation step of forming a modified region and a fracture in the laminated body by irradiating the laminated body with a laser light after the laminating step,
  wherein the laminating step includes
  a first bonding step of preparing, as the semiconductor wafer, a first wafer and a second wafer, and bonding the circuit layer of the second wafer to the semiconductor substrate of the first wafer such that the respective functional elements of the first wafer and the respective functional elements of the second wafer correspond to each other,
  a grinding step of grinding the semiconductor substrate of the second wafer after the first bonding step, and
  a second bonding step of preparing a third wafer as the semiconductor wafer after the grinding step, and bonding the circuit layer of the third wafer to the semiconductor substrate of the second wafer such that the respective functional elements of the second wafer and the respective functional elements of the third wafer correspond to each other, and
  in the laser light irradiation step, the modified region is formed along a line to cut set to pass between the functional elements and the fracture extends from the modified region along a laminating direction of the laminated body by irradiating the semiconductor substrate of the third wafer with the laser light along the line to cut,
  wherein, in the laser light irradiation step, the modified region is formed such that the fracture reaches both ends of the laminated body in the laminating direction.

5. The laminated element manufacturing method according to claim 4,
  wherein the laminating step includes a preparation step of preparing a support substrate and the first wafer, and bonding the circuit layer of the first wafer to the support substrate before the first bonding step, and in the first bonding step, the second wafer and the first wafer bonded to the support substrate are prepared.

6. The laminated element manufacturing method according to claim 5, further comprising:

a support substrate removal step of removing the support substrate after the laminating step and before the laser light irradiation step, or after the laser light irradiation step.

7. A laminated element manufacturing method comprising:

a laminating step of forming a laminated body of a semiconductor wafer including a semiconductor substrate having a front surface and a rear surface and a circuit layer including a plurality of functional elements arranged in two-dimension along the front surface;

a laser light irradiation step of forming a modified region and a fracture in the laminated body by irradiating the laminated body with a laser light after the laminating step; and a modified region removal step of removing the modified region by grinding the semiconductor substrate on which the modified region is formed after the laser light irradiation step, wherein the laminating step includes a first bonding step of preparing, as the semiconductor wafer, a first wafer and a second wafer, and bonding the circuit layer of the second wafer to the circuit layer of the first wafer such that the respective functional elements of the first wafer and the respective functional elements of the second wafer correspond to each other, a grinding step of grinding the semiconductor substrate of the second wafer after the first bonding step, and a second bonding step of preparing a third wafer as the semiconductor wafer after the grinding step, and bonding the circuit layer of the third wafer to the semiconductor substrate of the second wafer such that the respective functional elements of the second wafer and the respective functional elements of the third wafer correspond to each other, and in the laser light irradiation step, the modified region is formed along a line to cut set to pass between the functional elements and the fracture extends from the modified region along a laminating direction of the laminated body by irradiating the semiconductor substrate of the first wafer with the laser light along the line to cut.

8. A laminated element manufacturing method comprising:

a laminating step of forming a laminated body of a semiconductor wafer including a semiconductor substrate having a front surface and a rear surface and a circuit layer including a plurality of functional elements arranged in two-dimension along the front surface;

a laser light irradiation step of forming a modified region and a fracture in the laminated body by irradiating the laminated body with a laser light after the laminating step; and a modified region removal step of removing the modified region by grinding the semiconductor substrate on which the modified region is formed after the laser light irradiation step, wherein the laminating step includes a first bonding step of preparing, as the semiconductor wafer, a first wafer and a second wafer, and bonding the circuit layer of the second wafer to the semiconductor substrate of the first wafer such that the respective functional elements of the first wafer and the respective functional elements of the second wafer correspond to each other, a grinding step of grinding the semiconductor substrate of the second wafer after the first bonding step, and a second bonding step of preparing a third wafer as the semiconductor wafer after the grinding step, and bonding the circuit layer of the third wafer to the semiconductor substrate of the second wafer such that the respective functional elements of the second wafer and the respective functional elements of the third wafer correspond to each other, and in the laser light irradiation step, the modified region is formed along a line to cut set to pass between the functional elements and the fracture extends from the modified region along a laminating direction of the laminated body by irradiating the semiconductor substrate of the third wafer with the laser light along the line to cut.

* * * * *